(12) United States Patent
Iwasaki

(10) Patent No.: US 6,881,529 B2
(45) Date of Patent: Apr. 19, 2005

(54) POSITIVE PHOTORESIST TRANSFER MATERIAL AND METHOD FOR PROCESSING SURFACE OF SUBSTRATE USING THE TRANSFER MATERIAL

(75) Inventor: Masayuki Iwasaki, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 324 days.

(21) Appl. No.: 10/143,567

(22) Filed: May 13, 2002

(65) Prior Publication Data

US 2003/0087179 A1 May 8, 2003

(30) Foreign Application Priority Data

May 14, 2001  (JP) ........................................ 2001-143850

(51) Int. Cl.[7] ............................ G03F 7/023; G03F 7/40; G03C 1/805
(52) U.S. Cl. ........................ 430/166; 430/258; 430/262; 430/263
(58) Field of Search ................................ 430/166, 258, 430/262, 263

(56) References Cited

U.S. PATENT DOCUMENTS

| 5,002,850 A | * | 3/1991 | Shinozaki et al. | ........... 430/166 |
| 5,292,613 A | * | 3/1994 | Sato et al. | ................... 430/257 |
| 5,294,516 A | * | 3/1994 | Sato et al. | ................... 430/262 |

FOREIGN PATENT DOCUMENTS

| JP | 6-27657 | 2/1994 |
| JP | 10-97061 | 4/1998 |
| JP | 2794242 | 6/1998 |
| JP | 10-206888 | 8/1998 |
| JP | 2873889 | 1/1999 |
| JP | 2000-105466 | 4/2000 |

* cited by examiner

*Primary Examiner*—John S. Chu
(74) *Attorney, Agent, or Firm*—Sughrue Mion, PLLC

(57) ABSTRACT

A positive photoresist transfer material, wherein an alkali-soluble thermoplastic resin layer, an intermediate layer and a positive photoresist layer are successively applied on an adhesive surface of a temporary support, and adhesion between the positive photoresist layer and the intermediate layer is less than adhesion between other layers or surfaces.

20 Claims, 4 Drawing Sheets

Step(a)

Step(b)

Step(c)

Step(d)

ULTRAVIOLET RAY
Step(e)

Step(f)

Step(g)

Step(h)

Step(A)

Step(B)

Step(C)

Step(D)

Step(E)

Step(F)

Step(G)

Step(H)

Step(I)

Step(J)

Step(K)

POSITIVE PHOTORESIST TRANSFER MATERIAL AND METHOD FOR PROCESSING SURFACE OF SUBSTRATE USING THE TRANSFER MATERIAL

BACKGROUND OF THE INVENTION

1. Field of the Invention

The present invention relates to a positive photoresist transfer material and a method for processing a surface of a substrate using the transfer material. More specifically, the present invention relates to a transfer material which is suitable for providing a photoresist layer on a substrate such as a TFT array substrate via a transfer method in order to conduct photoetching, and relates to a method of photoetching using the transfer material.

2. Description of the Related Art

As substrates for liquid crystal displays (LCDs), plasma display panels (PDPs) and the like have tended to be made larger and more precise, etching photoresists used in the manufacture of thin-film transistors (TFTs) or electrode plates have been required to have not only higher sensitivity, uniformity and resist saving ability but also adhesiveness to various substrates and dry-etching resistance (heat resistance). In particular, as substrates have been enlarged in recent years, there has been a strict demand for uniformity with regard to various points such as thickness and shape. For example, uniformity in thickness of the coating film between a central portion and a peripheral portion of the substrate has been required, and dimension uniformity due to demand for resolution enhancement has been required.

In conventional etching resists, an alkali-soluble phenol novolak resin, a 1,2-quinonediazide compound and a solvent are used as main components thereof, and a liquid composition comprising an adhesion accelerator, a coating aid, a colorant and the like is also used (Japanese Patent Application Laid-Open (JP-A) Nos. 6-27657 and 2000-105466). TFT array substrates and electrode plates for PDPs are manufactured by applying an etching resist to a conductive base material or an insulating base material which is sputtered on a glass or transparent plastic substrate, and then by subjecting a thin film of each layer to a process including drying, pattern exposure, development, etching and resist separation (hereinafter, referred to as a photoetching process). There are two methods for performing the etching: a wet-etching method using various liquid etchants, and a dry-etching method using ions or radicals (active type radicals) generated by decomposing gas with plasma in a pressure reducing device so as to vaporize and remove the film on the substrate.

As an example using the etching resist, a typical method for producing a TFT array substrate for an LCD will be described referring to FIG. 3 which shows a basic cross-sectional structure of the TFT. (1) A gate electrode 12a and a Cs electrode 12b are provided on a glass substrate 11 by using molybdenum tantalum (MoTa) or the like. (2) Then, a gate oxide film is formed on the gate electrode 12a by a silicon oxide (SiOx) film 13 and a nitride (SiNx) film 14. (3) An amorphous silicon (a-Si) layer 15 serving as a semiconductor activating layer is formed on the gate oxide film. (4) Further, an a-Si layer 16 mixed with $N^+$ impurities for reducing bond resistance is provided on the a-Si layer 15. (5) Thereafter, a drain electrode 17a and a source electrode 17b are formed using a metal such as aluminum. The drain electrode 17a is connected to a data signal line, and the source electrode 17b is connected to a pixel electrode (or sub-pixel electrode) 19. (6) Finally, a protective film for protecting the a-Si layer 16, the drain electrode 17a and the source electrode 17b is provided via a nitride (SiNx) film 18.

A process for manufacturing a TFT array will now be described with reference to FIG. 4. First, in step (A), a metal film 22 for forming a gate electrode is sputtered on the entire surface of an insulating glass substrate 21. Possible examples of the metal include tantalum (Ta), aluminum (Al), alloys such as molybdenum tantalum (MoTa) and molybdenum tungsten (MoW), and the like.

Then, in step (B), a metal pattern 22a is formed by conducting photoresist application, drying, mask exposure, development and etching (hereinafter, this series of processes is simply referred to as a photoetching process). Thereafter, in step (C), a gate oxide (SiOx) film 23 is formed thereon by using a CVD technique.

Subsequently, by using the CVD technique, in step (D), a semiconductor (a-Si) film 24 is deposited thereon, and in step (E), a layer 25 to which a slight amount of phosphorus (N+) has been added is further formed thereon. Then, in step (F), only portions thereof that are to be included in the TFT are patterned via the photoetching process to form a semiconductor layer (a-Si film) 24a and a layer 25a. After that, in step (G), an ITO film 26, which is a transparent conductive film for a pixel electrode, is sputtered, and in step (H), a pixel electrode 26a is formed through the photoetching process.

Next, in order to form a power supply portion for a storage capacitor Cs, in step (I), a portion 23a of the gate oxide film 23 on the Cs is patterned and removed via the photoetching process. Subsequently, in step (J), a metal 27 such as aluminum or titanium is sputtered on portions of the TFT that are to be a drain electrode 27a and a source electrode 27b, and in step (K), the portions are patterned through the photoetching process to form the drain electrode 27a and the source electrode 27b.

Finally, in order to protect elements such as the TFT, for example, a protective nitride (SiNx) film or the like is grown by the CVD. After being grown, the film is patterned through the photoetching process to form the protective film, and the TFT array is thereby completed.

In order to form the fine patterns by photoetching, a photoresist composition is generally used, which has two main components: an alkali-soluble novolak resin having a phenolic hydroxyl group, and a photosensitive substance having a 1,2-quinonediazide group as a photosensitive group. The coating thickness of the photoresist film is generally 0.5 to several micrometers.

The photoresist composition is used to form images having pattern dimensions widely ranged from about 0.3 micrometers (sub-half micron range) up to several tens or hundreds of micrometers, which enables fine process for surfaces of various substrates.

The photoresist composition is a positive photoresist which can be developed with alkaline water. The positive photoresist is more widely used than a negative photoresist such as rubber-type photoresist which requires being developed with a solvent, because in the case of the former, for example, the resolution is superior, the acid resistance and the etching resistance are more satisfactory, the problem of waste solution disposal is less serious (since no solvent is used in development), and most significantly because variation in image dimensions resulting from swelling during development is extremely small, whereby the dimension control is relatively easier.

As techniques for TFTs and STNs have been improved, line widths in LCDs and the like have tended to be made thinner and finer. For example, although design dimensions of elements using conventional TN or STN liquid crystals were 200 to several hundreds of micrometers, minimum design dimensions thereof have been reduced to at most 100 micrometers due to newly developed techniques. Further, minimum design dimensions of TFT display elements requiring excellent response ability or imaging ability have been reduced to a level of several micrometers.

The photoresist material has been required to maintain a capacity for fine processing and at the same time correspond to large areas. It has been important for enlarged substrates of liquid crystal displays and substrates, which were originally intended to be large, such as those of PDPs, to realize a uniform film thickness in the display.

In the case of large displays, it has commonly been required to further reduce costs and to decrease the amount of photoresist solution used.

In order to improve the uniformity of film thickness in the display and to decrease the amount of photoresist solution used, methods for coating have been continuously under study. As a result, in place of a conventional spin coater, a slit coater has been newly developed. However, while the slit coater holds promise for handling substrates having a size of up to 550 mm×680 mm, difficulties are forseen if it is to be applied to even larger substrates.

In a field of printed wiring boards, so-called dry film photoresists are widely used, which can correspond to substrates having a width of about 600 mm. The dry film photoresist material is produced by coating a polyester film having a thickness of 20 to 25 $\mu$m, which is a temporary support, with a negative photopolymerizable resin which can be developed with alkaline water, so as to generally have a thickness of 10 to 80 $\mu$m, and then overlaying a polyolefine film having a thickness of 4 to 20 $\mu$m thereon as a protective film. However, when the photoresist material is used in the field of printed wiring boards, a required resolution thereof is at most 30 to 300 $\mu$m. In general, the photoresist material is developed with an alkalescent aqueous solution which is typically a sodium carbonate aqueous solution having a concentration of 1%, a conductive material, generally copper, on the substrate is etched with a cupric chloride aqueous solution, and resist separation is conducted by using a caustic soda or caustic potash aqueous solution having a concentration of 2 to 3%.

Photoresists used for TFTs for LCDs, however, are required to correspond to the following conditions: high-resolution of 2 to 10 $\mu$m, metaion free development, separation via an organic separating solution, and undergoing an etching process for a metal thin film such as ITO, Ta or Al or for an inorganic thin film such as SiNx or ITO. In order to meet to these conditions, the photoresists are required to have a thickness of several micrometers, adhesiveness to various sputtered metal or inorganic thin film materials, uniform film thickness, an ability to follow preceding TFT patterns having deviations in thickness of about 1 $\mu$m, a capacity for high-speed lamination onto substrates having a width of 1 to 2 m, and the like. These conditions, however, completely exceed the limitations of conventional dry film resists. As described above, the conventional method of coating with the positive liquid resists or that of transferring the negative dry film photoresists cannot meet the needs of LCD and PDP fields.

A method for providing a color or colorless negative photoresist layer on a color filter substrate has been suggested, in which a thermoplastic resin layer, an intermediate layer and a negative photoresist layer are sequentially applied and dried on a film support to obtain a negative photoresist transfer material, and the negative photoresist transfer material obtained is transferred onto the color filter substrate, which has preceding pixels and deviations in thickness of about 2 $\mu$m (Japanese Patent Application Registration Nos. 2,794,242 and 2,873,889; and JP-A Nos. 10-97061 and 10-206888). In short, this is a method of forming a color filter or an overcoat layer, characterized in that a film having the negative photoresist layer is attached by using a lamination technique, and then patterning is conducted. In this method, while the negative photoresist layer, which is a thin film having a thickness of 1 to 5 $\mu$m, can be rapidly transferred onto the substrate having unevenness, the resolution is limited due to its being of the negative type. Therefore, although a photoresist layer of a positive type is desired, there have as yet been no practical positive photoresist layers successfully provided.

This is because most conventional positive photoresists comprise a phenol novolak resin as a main component and 1,2-quinonediazide sulfonate as a photosensitive component, and the films are therefore brittle and less flexible, which makes them difficult to produce as rolled products. Since rolled products of a desired width are generally obtained by slitting a wide roll on which the photoresist layer has been applied, if a brittle film has been applied thereon, unfavorable chips tend to be generated during the slitting. Further, the photoresist layer is generally heat-transferred onto a substrate to be processed by photolithography while the rolled film is being pressed thereon by a laminator. Therefore, chips may be also generated when the film is processed or cut in a longitudinal direction of the substrate after lamination. Since dust from the chips pollutes an operating environment of the substrate and the laminator, transfer layers with few defects have been difficult to obtain.

Conventionally, in the well-known photoresist material comprising the temporary support, the thermoplastic resin layer, the intermediate layer and the photosensitive layer, bubbles are generated when the temporary support and the thermoplastic resin layer are separated from each other or when the thermoplastic resin layer and the intermediate layer are separated from each other (for example, Japanese Patent Application Registration Nos. 2,794,242 and 2,873,889), because nitrogen gas (which results from photodecomposition of 1,2-quinonediazide) is generated after exposure. The bubbles unfavorably reduce the sensitivity and the sharpness of pattern edges.

SUMMARY OF THE INVENTION

It is an object of the present invention to solve the above-described problems of the prior art, i.e., to enable semiconductor circuits for large-sized TFT substrates and PDP substrates to be formed, by preparing a transfer material comprising a temporary support, a thermoplastic resin layer, an intermediate layer and a photoresist layer, by separating the intermediate layer and the photoresist layer from each other, and by forming the positive photoresist layer on the substrate using the transfer method.

As a result of eager study in view of the above facts, the inventor of the present invention has found that the positive photoresist transfer material having a multi-layered structure is effective, and on the basis of this, he has produced the present invention. That is a first aspect of the present invention is a positive photoresist transfer material for transfer to a substrate. The positive photoresist transfer material comprises: a temporary support including opposite surfaces, one surface of which comprises an adhesive surface; an antistatic layer provided on the surface opposite to said adhesive surface; an alkali-soluble thermoplastic resin layer, an intermediate layer and a positive photoresist layer disposed in that sequence on said adhesive surface, the photoresist layer comprising an alkali-soluble carboxylic acid group containing resin and a 1,2-quinonediazide compound; and a protective film disposed on the positive photoresist layer, wherein, when the positive photoresist transfer material is transferred onto the substrate, adhesion between the positive photoresist layer and the intermediate layer is less than adhesion between other layers or surfaces.

The positive photoresist transfer material is a material wherein adhesion between the temporary support and the alkali-soluble thermoplastic resin layer and the like is higher than adhesion between the positive photoresist layer and the intermediate layer. Therefore, when the temporary support is removed after transfer to the substrate, peeling between the positive photoresist layer and the intermediate layer can be carried out without problems.

Second aspect of the present invention is a method for producing a positive photoresist transfer material for transfer to a substrate. The method comprises the steps of: forming an alkali-soluble thermoplastic resin layer on an adhesive surface of a temporary support by applying and drying a solution, wherein the temporary support includes an antistatic layer; forming an intermediate layer by applying and drying a solution, wherein the solution for the intermediate layer contains a solvent which does not significantly dissolve the alkali-soluble thermoplastic resin layer but slightly swells the alkali-soluble thermoplastic resin layer; forming a positive photoresist layer by applying and drying a solution, wherein the solution for the positive photoresist layer contains an alkali-soluble carboxylic acid group containing resin, a 1,2-quinonediazide compound and a solvent which does not significantly dissolve the intermediate layer; and laminating the photoresist layer with a protective film, wherein, when the positive photoresist transfer material is transferred onto a substrate, adhesion between the positive photoresist layer and the intermediate layer is less than adhesion between other layers or surfaces.

Third aspect of the present invention is a method for processing a surface of a substrate. The method comprises the steps of: preparing a positive photoresist transfer material, by providing an antistatic layer on a surface of a temporary support, and an adhesive surface opposite to the antistatic layer, successively applying an alkali-soluble thermoplastic resin layer, an intermediate layer and a positive photoresist layer on the adhesive surface of the temporary support, and laminating a protective film on the positive photoresist layer, wherein the positive photoresist layer comprises an alkali-soluble carboxylic acid group containing resin and a 1,2-quinonediazide compound; overlaying the positive photoresist transfer material on the substrate, wherein, when the positive photoresist transfer material is transferred after having been overlaid on the substrate, adhesion between the positive photoresist layer and the intermediate layer is less than adhesion between other layers or surfaces; separating the positive photoresist layer and the intermediate layer from each other so as to remove the temporary support disposed with the alkali-soluble thermoplastic resin layer and the intermediate layer; pattern-exposing the positive photoresist layer on the substrate; developing the positive photoresist layer; and etching the positive photoresist layer and separating it by using a resist separating solution.

DESCRIPTION OF THE PREFERRED EMBODIMENTS

Figure 1:
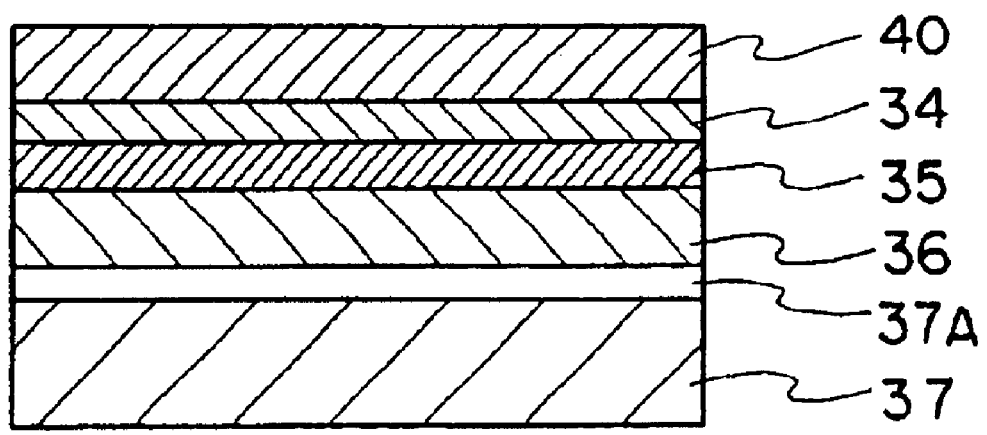
FIG. 1 is a cross-sectional view of a positive photoresist transfer material according to the present invention.

A preferred embodiment of the present invention will now be described.

In a positive photoresist transfer material having a multi-layered structure according to the present invention, an alkali-soluble thermoplastic resin layer, an intermediate layer and a positive photoresist layer are sequentially provided on an adhesive surface of a temporary support, having the adhesive surface and an antistatic surface. The positive photoresist layer is further laminated with a protective film. After the protective film is separated therefrom, the transfer material is overlaid on a substrate via at least heat and pressure and is cooled. Then, the intermediate layer and the positive photoresist layer can be separated from each other.

Temporary Support

In the present invention, the temporary support is a plastic film, such as, for example, a polyethylene terephthalate film, a polyethylene naphthalate film, a cellulose triacetate film, a cellulose acetate butylate film, a cellulose acetate propionate film, a polycarbonate film, a polystyrene film, or a polyethylene film. Among these, a polyethylene terephthalate film is preferable, and a polyethylene terephthalate film which is biaxially oriented and thermoset is especially preferable in terms of stability, toughness and the like.

Although the thickness of the temporary support is not particularly limited, it is generally within a range of 5 to 200 μm, preferably within a range of 10 to 150 μm, and more preferably within a range of 20 to 130 μm in terms of ease of handling, flexibility and the like. The temporary support may be transparent or semitransparent, may contain dye-type silicon, alumina sol, chrome salt, zirconium salt and the like, and may be colored.

Surface-Active Treatment

In order to bond the thermoplastic resin layer rigidly onto the surface of the temporary support, any one of the following surface treatments (surface-active treatments) is generally conducted. In general, the same surface treatment is also conducted for the other surface thereof on which an antistatic layer (backing layer) is formed.

There are two methods for forming the thermoplastic resin layer on the temporary support. In a first method, any one of surface-active treatments such as a chemical treatment, a mechanical treatment, a corona discharge treatment, a flame treatment, an ultraviolet treatment, a high-frequency treatment, a glow discharge treatment, an active-plasma treatment, a laser treatment, a mixed-acid treatment and an ozone-acid treatment is conducted for the temporary support to obtain adhesiveness, and thereafter a coating solution for the thermoplastic resin layer is applied to the temporary support. In a second method, any one of the above-listed surface-active treatments is conducted for the temporary support, thereafter an undercoat is provided on the temporary support, and the thermoplastic resin layer is applied onto the undercoat. Of the two methods, the latter method is more effective. Via these surface treatments, some or a number of polar groups may be formed on the surface of the temporary support which was originally hydrophobic, a thin layer which adversely affects adhesiveness of the surface may be removed, and/or crosslinking density of the surface may be increased to increase the adhesiveness thereof. As a result, affinity between components contained in a solution for the undercoat and the polar groups of the temporary support may be increased, and fastness of the adhesive surface may be increased, whereby adhesion between the undercoat and the surface of the temporary support may be improved.

There are two methods for applying the undercoat. In a multi-layer method, a layer that sufficiently adheres to the temporary support is formed as a first layer and a gelatin layer is formed thereon as a second layer. In a single-layer method, only one resin layer that contains both hydrophobic groups and hydrophilic groups is formed. An example of the multi-layer method for applying the undercoat is a method in which a first high molecular substance undercoat and a second gelatin undercoat are formed with aqueous solutions. Examples of the high molecular substance for the first undercoat include a copolymer whose starting material is a monomer selected from vinyl chloride, vinylidene chloride, butadiene, methacrylic acid, acrylic acid, itaconic acid, maleic anhydride and the like; polyethylene-imine; epoxy resin grafted gelatin; nitrocellulose; and the like. In order to form this first undercoat and the second gelatin undercoat, a curing agent such as a dichlorotriazine derivative or an epoxy compound is generally used as well.

If desired, a swelling agent, such as phenol or resorcin, may be added to the first undercoat in an amount of 1 to 10 g per 1 liter of the coating solution for the first undercoat. As the first undercoat, a hydrophilic polymer may be used. Possible examples thereof include a natural polymer, such as gelatin, or a synthetic polymer, such as polyvinyl alcohol, a vinyl acetate-maleic anhydride copolymer, an acrylic acid-acrylamide copolymer or a styrene-maleic anhydride copolymer. Further, a blocking inhibitor such as a matting agent (silicon dioxide, polymethyl acrylate, polystyrene), methyl cellulose or polyvinyl alcohol can be added to the first undercoat.

The coating solution for the first undercoat can be applied by a generally well-known coating method, such as a dip coating method, an air-knife coating method, a curtain coating method, a roller coating method, a wire-bar coating method, a gravure coating method, or an extrusion coating method using a hopper (described in U.S. Pat. No. 2,681,294). When the second undercoat is further provided on the first undercoat, the at least two undercoats can be simultaneously applied as needed by any one of methods described in U.S. Pat. Nos. 2,761,791, 3,508,947, 2,941,898 and 3,526,528, and in Coating Technology written by Hitoshi Ozaki, p. 253 (published by Asakura Shoten, 1973).

The first undercoat and the second undercoat, which is provided on the first undercoat, are applied in an amount of preferably 0.01 to 10 g, and especially preferably 0.2 to 3 g, as solid content, per 1 $m^2$ of the temporary support which is a polyester film.

In the present invention, a hydrophilic colloid layer, whose main component is gelatin, is preferably provided as the second undercoat on the first undercoat. Examples of a hydrophilic polymer other than gelatin, which may be used as the second undercoat, include the following synthetic or natural hydrophilic high molecular compounds: acylated gelatins such as a phthalated gelatin and a maleated gelatin; cellulose derivatives such as carboxymethyl cellulose and hydroxyethyl cellulose; grafted gelatin in which acrylic acid, methacrylic acid, amide or the like is grafted in gelatin; polyvinyl alcohol, polyhydroxy alkyl acrylate, polyvinyl pyrrolidone, a vinyl pyrrolidone/vinyl acetate copolymer, casein, agarose, albumin, soda alginate, polysaccharide, agar-agar, starch, graft starch, polyacrylamide, a polyethylene-imine acyl compound, and homopolymers or copolymers of acrylic acid, acrylamide methacrylate, N-substituted acrylamide and N-substituted methacrylamide, or partial hydrolyzed products thereof. These can be used singly or in combination. An antistatic agent, a crosslinking agent, a matting agent, a blocking inhibitor and/or the like can be added to the above hydrophilic polymer as needed.

Antistatic Layer

The positive photoresist transfer material tends to have static electricity due to contact friction, whereby abrasion and unpreferable peeling of the photoresist transfer material tend to easily occur, and dust tends to easily adhere thereto. The occurrence of abrasion and peeling and the adhesion of dust result in generation of defects such as repelling and adhesion of foreign material during application and drying of the positive photoresist resin layer or other layers. Further, when the static electricity, which has been accumulated in the positive photoresist transfer material due to contact friction or temporary support separation, is discharged, the TFT may be broken or damaged during the TFT manufacturing process, resulting in critical defects.

Therefore, it is known that an antistatic layer containing a conductive polymer, an ionic or non-ionic surfactant, colloidal silica, a metallic oxide or a composite oxide thereof, or the like is generally provided for the photosensitive material. However, an antistatic agent such as a surfactant, which is soluble in an organic solvent, loses its antistatic property during manufacture of the positive photoresist transfer material, in which an organic solvent is generally applied thereto. Further, at a low humidity such as is common in winter, an antistatic agent such as a conductive polymer generally cannot sufficiently exhibit the antistatic property, because it is ion-conductive type. As the antistatic agent, a metallic oxide, a composite oxide thereof, or ones among these fine particles further containing a small number of heteroatoms therein are especially preferable, because they exhibit the antistatic property regardless of humidity. Antistatic layers including these particles are described in, for example, Japanese Patent Application Publication (JP-B) No. 1-20736, and JP-A Nos. 61-20033 and 4-39651.

The antistatic layer and, as needed, a surface layer are sequentially provided on the surface of the temporary support, on which the thermoplastic resin layer is not provided. In the antistatic layer, conductive metallic oxide particles are dispersed in a cured product of a melamine compound and any one of the following polymers or a mixture thereof. As the polymer, an acrylic resin, a vinyl resin, a polyurethane resin and/or a polyester resin are used.

Examples of a material for the conductive metallic oxide particles include ZnO, $TiO_2$, $SnO_2$, $Al_2O_3$, $In_2O_3$, MgO, BaO and $MoO_3$, composite oxides thereof, and ones among these metallic oxides further containing heteroatoms therein. The metallic oxide is preferably $SnO_2$, ZnO, $Al_2O_3$, $TiO_2$, $In_2O_3$ and/or MgO, more preferably $SnO_2$, ZnO, $In_2O_3$ and/or $TiO_2$, and especially preferably $SnO_2$.

Examples of the metallic oxides containing a small number of heteroatoms include ZnO containing Al or In, $TiO_2$ containing Nb or Ta, $In_2O_3$ containing Sn, and $SnO_2$ containing Sb, Nb or a halogen element, wherein the metallic oxide is doped with the heteroelement in an amount of 0.01 to 30 mol % (preferably 0.05 to 20 mol %, and more preferably 0.1 to 10 mol %). When the heteroelement is added thereto in an amount less than 0.01 mol %, conductivity is not sufficiently imparted to the oxide or the composite oxide, and when the heteroelement is added thereto in an amount more than 30 mol %, a blackening degree of the particles is increased so that the antistatic layer becomes blackened and thereby unsuitable for the sensitive material. Accordingly, in the present invention, as the material for the conductive metallic oxide particles, the metallic oxide or the composite metallic oxide containing a small amount of heteroelement is preferable. Further, a metallic oxide containing an oxygen defect in its crystal structure is also preferable.

The conductive metallic oxide particles are contained in the antistatic layer in an amount preferably within a range of 10 to 1,000% by mass, more preferably within a range of 100 to 900% by mass, and still more preferably within a range of 200 to 800% by mass, with respect to a binder (sum of the polymer and the melamine compound). When the conductive metallic oxide particles are contained therein in an amount less than 10% by mass, the antistatic property cannot be sufficiently obtained, and when the conductive metallic oxide particles are contained therein in an amount more than 1,000% by mass, the conductive metallic oxide particles cannot be prevented from falling off of the sensitive material. A diameter of the conductive metallic oxide particle is preferably as small as possible so as not to generate unevenness in the transferred photoresist layer. In general, an average particle diameter is within a range of 0.001 to 0.5 $\mu$m, preferably within a range of 0.002 to 0.3 $\mu$m, and more preferably within a range of 0.003 to 0.2 $\mu$m. The average particle diameter used herein is not only for primary particle diameters but also for higher-order particle diameters of the conductive metallic oxide particles such as agglomerate of the particles.

When the metallic oxide fine particles are added to the coating solution for forming the antistatic layer, they may be merely added to be dispersed therein. However, it is preferable that a dispersion in which the metallic oxide fine particles are dispersed in a solvent such as water (containing a dispersant and/or a binder as needed) is added to the coating solution.

As the binder for dispersing and supporting the conductive metallic oxide particles, the antistatic layer in the present invention preferably contains a cured product of the polymer (an acrylic resin, a vinyl resin, a polyurethane resin or a polyester resin) and a melamine compound. In the present invention, in view of maintaining a satisfactory working environment and preventing air pollution, it is preferable that the polymer and the melamine compound used are water-soluble, or that the polymer and the melamine compound used are dispersed in water (e.g., in an emulsion state). Further, the polymer has any one or more of groups including a methylol group, a hydroxyl group, a carboxyl group and a glycidyl group, preferably a hydroxyl group and/or a carboxyl group, and especially preferably a carboxyl group, so as to enable crosslinking reaction with the melamine compound. The content of the hydroxyl group or the carboxyl group in the polymer is preferably 0.0001 to 1 equivalent/1 kg, more preferably 0.0005 to 1 equivalent/1 kg, and especially preferably 0.001 to 1 equivalent/1 kg.

The acrylic resin may be a homopolymer out of monomers of any one of the following components, or a copolymer obtained by polymerizing monomers of at least two of the following components: acrylic acid, acrylic esters such as alkyl acrylate, acrylamide, acrylonitrile, methacrylic acid, methacrylic esters such as alkyl methacrylate, methacrylamide and methacrylonitrile. Out of these, a homopolymer or copolymer of acrylic esters such as alkyl acrylate and/or methacrylic esters such as alkyl methacrylate is preferable, an example of which is that of acrylic esters and/or methacrylic esters having an alkyl group with 1 to 6 carbon atoms. The acrylic resin is a polymer, which is mainly composed of the above components, and which is obtained by partially using monomers having any one of groups such as a methylol group, a hydroxyl group, a carboxyl group and a glycidyl group so as to enable crosslinking reaction with the melamine compound.

Examples of the vinyl resin include polyvinyl alcohol, acid-denatured polyvinyl alcohol, polyvinyl formal, polyvinyl butyral, polyvinyl methyl ether, polyolefine, an ethylene/butadiene copolymer, polyvinyl acetate, a vinyl chloride/vinyl acetate copolymer, a vinyl chloride/(meth)acrylic ester copolymer, and an ethylene/vinyl acetate copolymer (preferably, an ethylene/vinyl acetate/(meth)acrylic ester copolymer).

Out of these, polyvinyl alcohol, acid-denatured polyvinyl alcohol, polyvinyl formal, polyolefine, an ethylene/butadiene copolymer, and an ethylene/vinyl acetate copolymer (preferably, an ethylene/vinyl acetate/(meth)acrylic ester copolymer) are preferable. In order to enable crosslinking reaction with the melamine compound, when the vinyl resin is polyvinyl alcohol, acid-denatured polyvinyl alcohol, polyvinyl formal, polyvinyl butyral, polyvinyl methyl ether or polyvinyl acetate, it is preferable that the vinyl resin is a polymer which has a hydroxyl group by leaving, for example, a vinyl alcohol unit in the polymer. When the vinyl resin is another polymer, it is preferable that the vinyl resin is a polymer which is obtained by partially using monomers having at least one of groups consisting of a methylol group, a hydroxyl group, a carboxyl group and a glycidyl group.

The polyurethane resin may be a polyurethane which is derived from polyisocyanate and one of or a mixture of a polyhydroxy compound (e.g., ethylene glycol, propylene glycol, glycerin, trimethylol propane), aliphatic polyester polyol obtained by reaction between a polyhydroxy compound and a polybasic acid, polyether polyol (e.g., poly(oxypropylene ether) polyol, poly(oxyethylene-propylene ether) polyol), polycarbonate polyol and polyethylene terephthalate polyol. The polyurethane resin can use an unreacted hydroxyl group left over after reaction, for example, between polyol and polyisocyanate, as a functional group which is capable of crosslinking with the melamine compound.

As the polyester resin, a polymer is used, which is generally obtained by reaction between a polyhydroxy compound (e.g., ethylene glycol, propylene glycol, glycerin, trimethylol propane) and a polybasic acid. The polyester resin can use an unreacted hydroxyl group and an unreacted carboxyl group left over after reaction, for example, between polyol and a polybasic acid, as functional groups which are capable of crosslinking with the melamine compound. Of course, a third component having a functional group such as a hydroxyl group may be added to the polyester resin. Out of the examples of the polymer, the acrylic resin and the polyurethane resin are preferable, and the acrylic resin is especially preferable.

Examples of the melamine compound include a compound containing at least two (preferably at least three) methylol groups and/or alkoxymethyl groups in a melamine molecule, and a melamine resin or a melamine-urea resin which is a condensation polymer thereof. Examples of an initial condensation product of melamine and formalin include dimethylol melamine, trimethylol melamine, tetramethylol melamine, pentamethylol melamine, hexamethylol melamine and the like. Specific, commercially available examples thereof include Sumitex Resin M-3, MW, MK and MC (manufactured by Sumitomo Chemical Co., Ltd.), but are not limited thereto.

Examples of the condensation polymer include a hexamethylol melamine resin, a trimethylol melamine resin, a trimethylol trimethoxymethyl melamine resin and the like. Commercially available examples thereof include MA-1 and MA-204 (manufactured by Sumitomo Bakelite Co., Ltd.), BECKAMINE MA-S, BECKAMINE APM and BECKAMINE J-101 (manufactured by Dainippon Ink & Chemicals, Inc.), Euroid 344 (manufactured by Mitsui Toatsu Chemicals, Inc.), and Oshika Resin M31 and Oshika Resin PWP-8 (manufactured by Oshika Shinko Co., Ltd.), but are not limited thereto.

The melamine compound preferably has a functional group equivalent of 50 to 300, which is a value obtained by dividing the molecular weight by the number of functional groups in a molecule, wherein the functional group is a methylol group and/or an alkoxymethyl group. When the value is more than 300, a curing density is low and high strength cannot be thereby obtained, and if an amount of the melamine compound is increased, a coating ability is decreased. When the curing density is low, abrasion is easily generated, and a capacity for holding the conductive metallic oxide is reduced. When the functional group equivalent is less than 50, the curing density is high, but transparency is lost. Then even if the amount of the melamine compound is decreased, transparency is not restored. In the present invention, the aqueous melamine compound is added to the polymer in an amount of 0.1 to 100% by mass, and preferably in an amount of 10 to 90% by mass.

These melamine compounds may be used singly or in combination. Further, these melamine compounds can be used in combination with other compounds, such as curing agents described in *The Theory of the Photographic Process*, Third edition, by C. E. K. Meers and T. H. James, (1966); U.S. Pat. Nos. 3,316,095, 3,232,764, 3,288,775, 2,732,303, 3,635,718, 3,232,763, 2,732,316, 2,586,168, 3,103,437, 3,017,280, 2,983,611, 2,725,294, 2,725,295, 3,100,704, 3,091,537, 3,321,313, 3,543,292 and 3,125,449; and U.K. Patent Application Nos. 994,869 and 1,167,207; and the like.

Typical examples of the curing agents include aldehyde compounds and derivatives thereof, such as mucochloric acid, mucobromic acid, mucophenoxychloric acid, mucophenoxybromic acid, formaldehyde, glyoxal, monomethylglyoxal, 2,3-dihydroxy-1,4-dioxane, 2,3-dihydroxy-5-methyl-1,4-dioxane succinaldehyde, 2,5-dimethoxytetrahydrofuran, and glutaraldehyde; active vinyl compounds, such as divinylsulfone-N,N'-ethylenebis(vinylsulfonylacetamide), 1,3-bis(vinylsulfonyl)-2-propanol, methylenebismaleimide, 5-acetyl-1,3-diacryloyl-hexahydro-s-triazine, 1,3,5-triacryloyl-hexahydro-s-triazine, and 1,3,5-trivinylsulfonyl-hexahydro-s-triazine; active halogen compounds, such as a sodium salt of 2,4-dichloro-6-hydroxy-s-triazine, a sodium salt of 2,4-dichloro-6-(4-sulfoanilino)-s-triazine, 2,4-dichloro-6-(2-sulfoethylamino)-s-triazine, and N,N'-bis(2-chloroethylcarbamyl)piperazine; epoxy compounds, such as bis(2,3-epoxypropyl)methylpropyl ammonium p-toluenesulfonate, 1,4-bis(2',3'-epoxypropyloxy)butane, 1,3,5-triglycidyl isocyanurate, 1,3-diglycidyl-5-(γ-acetoxy-β-oxypropyl)isocyanurate, sorbitol polyglycidyl ethers, polyglycerol polyglycidyl ethers, pentaerythritol polyglycidyl ethers, a diglycerol polyglycidyl ether, 1,3,5-triglycidyl(2-hydroxyethyl)isocyanurate, glycerol polyglycerol ethers, and trimethylolpropane polyglycidyl ethers; ethyleneimine compounds, such as 2,4,6-triethylene-s-triazine, 1,6-hexamethylene-N,N'-bisethylene urea, and bis-β-ethyleneiminoethyl thioether; methanesulfonate compounds, such as 1,2-di(methanesulfonoxy)ethane, 1,4-di(methanesulfonoxy)butane, and 1,5-di(methanesulfonoxy)pentane; carbodiimide compounds, such as dicyclohexylcarbodiimide and 1-dicyclohexyl-3-(3-trimethylaminopropyl)carbodiimide hydrochloride; isoxazole compounds such as 2,5-dimethylisoxazole; inorganic compounds, such as chromium alum and chromium acetate; dehydration condensation type peptide reagents, such as N-carboethoxy-2-isopropoxy-1,2-dihydroquinoline and N-(1-morpholinocarboxy)-4-methylpyridinium chloride; active ester compounds, such as N,N'-adipoyldioxydisuccinimide and N,N'-terephthaloyldioxydisuccinimide; isocyanates, such as toluene-2,4-diisocyanate and 1,6-hexamethylene diisocyanate; and epichlorohydrin compounds such as a polyamide-polyamine-epichlorohydrin reaction product; but the curing agents are not limited thereto.

The antistatic layer and a surface layer (which will be described later) of the present invention can use a combination of a matting agent, a surfactant, a smoothing agent and the like, as needed. Examples of the matting agent include oxides such as a silicon oxide, an aluminum oxide and a magnesium oxide, which have a particle diameter of 0.001 $\mu$m to 10 $\mu$m; and polymers or copolymers such as polymethyl methacrylate and polystyrene; and the like. Well-known examples of the surfactant include anionic surfactants, cationic surfactants, ampholytic surfactants, nonionic surfactants and the like. Examples of the smoothing agent include a phosphoric ester of higher alcohol having 8 to 22 carbon atoms, or an amino salt thereof; a palmitic acid, a stearic acid and a behenic acid, and esters thereof; silicon compounds; and the like.

In order to prepare the coating solution for forming the antistatic layer of the present invention, just the conductive metallic oxide particles, or a dispersion in which the conductive metallic oxide particles are dispersed in a solvent such as water (containing a dispersant and/or a binder as needed), is added to and mixed with (and dispersed in as needed) a water dispersion or an aqueous solution containing the polymer, the melamine compound and appropriate additives. The coating solution for forming the antistatic layer can be applied onto the surface (on which the positive photoresist layer is not provided) of the plastic film, such as a polyester film, by a generally well-known coating method, such as a dip coating method, an air-knife coating method, a curtain coating method, a wire-bar coating method, a gravure coating method, or an extrusion coating method. The plastic film, such as a polyester film, may be of before sequential biaxial orientation, before simultaneous biaxial orientation, after monoaxial orientation and before re-orientation, or after biaxial orientation.

The surface of the plastic temporary support, on which the coating solution for forming the antistatic layer is applied, is preferably subjected in advance to a surface treatment, such as an ultraviolet treatment, a corona treatment or a glow discharge treatment. A thickness of the antistatic layer according to the present invention is preferably within a range of 0.01 $\mu$m to 1 $\mu$m, more preferably within a range of 0.01 $\mu$m to 0.5 $\mu$m, and still more preferably within a range of 0.01 $\mu$m to 0.2 $\mu$m. When the thickness is less than 0.01 $\mu$m, it is difficult to uniformly apply a coating agent and coating irregularity is thus easily generated in the end products, and when the thickness is more than 1 $\mu$m, antistatic properties and anti-abrasion properties may be inferior.

In the present invention, a surface layer is preferably provided on the antistatic layer. The surface layer is provided mainly in order to improve smoothness and anti-abrasion properties of the antistatic layer, and to assist the antistatic layer in preventing the conductive metallic oxide particles from being removed therefrom. Examples of a material for the surface layer include the following compounds, but are not limited thereto: (1) wax, resin and rubber-like substances comprising a homopolymer or a copolymer of 1-olefin type unsaturated hydrocarbon such as ethylene, propylene, 1-butene and 4-methyl-1-pentene, (for example, polyethylene, polypropylene, poly-1-butene, poly-4-methyl-1-pentene, an ethylene/propylene copolymer, an ethylene/1-butene copolymer, and a propylene/1-butene copolymer); (2) a rubber-like copolymer of at least two of the above 1-olefins and conjugated or non-conjugated diene, (for example, an ethylene/propylene/ethylidene norbornene copolymer, an ethylene/propylene/1,5-hexadiene copolymer, and an isobutene/isoprene copolymer); (3) a copolymer of 1-olefin and conjugated or non-conjugated diene, (for example, an ethylene/butadiene copolymer, and an ethylene/ethylidene norbornene copolymer); (4) a copolymer of 1-olefin (especially ethylene) and vinyl acetate, and a complete or partial saponified product thereof; (5) a graft polymer in which the conjugated or non-conjugated diene, vinyl acetate or the like is grafted in a homopolymer or a copolymer of 1-olefin, and a complete or partial saponified product thereof. These compounds are described in JP-B No. 5-41656. The material for the surface layer is preferably from among the above-listed polyolefins having a carboxyl group and/or a carboxylate group, and the polyolefin is generally used as an aqueous solution or a water dispersion in the present invention.

Water-soluble methyl cellulose whose substitution degree of methyl group is at most 2.5 may be added to the surface layer, preferably in an amount of 0.1 to 40% by mass with respect to a total amount of the binder forming the surface layer. The water-soluble methyl cellulose is described in JP-A No. 1-210947.

The surface layer can be formed by applying the coating solution (water dispersion or aqueous solution) containing the binder and the like onto the antistatic layer of the present invention, by a generally well-known coating method, such as a dip coating method, an air-knife coating method, a curtain coating method, a wire-bar coating method, a gravure coating method, or an extrusion coating method. A thickness of the surface layer is preferably within a range of 0.01 $\mu$m to 1 $\mu$m, more preferably within a range of 0.01 $\mu$m to 0.5 $\mu$m, and still more preferably within a range of 0.01 $\mu$m to 0.2 $\mu$m. When the thickness is less than 0.01 $\mu$m, it is difficult to uniformly apply a coating agent and coating irregularity is thus easily generated in the end products, and when the thickness is more than 1 $\mu$m, antistatic properties and anti-abrasion properties may be inferior.

Alkali-Soluble Thermoplastic Resin Layer

A resin for forming the alkali-soluble thermoplastic resin layer preferably has a substantial softening point of at most 80° C. and preferably comprises at least one selected from a saponified product of an ethylene/acrylic ester copolymer; a saponified product of a styrene/(meth)acrylic ester copolymer; a saponified product of a vinyltoluene/(meth)acrylic ester copolymer; a saponified product of a poly(meth)acrylic ester, a (meth)acrylic ester copolymer of butyl (meth)acrylate and vinyl acetate, or the like; and a copolymer of a (meth)acrylic acid and an ethylene unsaturated group containing monomer. Further, as the alkali-soluble thermoplastic resin, alkali-soluble substances selected from high polymeric organic substances having softening points of at most about 80° C. can be also used, which substances are listed in Plastic Performance Handbook (edited and authored by Japan Plastics Industry Federation and All Japan Plastic Molding Industry Association, published by Kogyo Chosakai Publishing Co., Ltd. on Oct. 25, 1968).

With regard to the other high polymeric organic substances having softening points of at least 80° C., if a plasticizer which is compatible with the high polymeric organic substances is added thereto, the substantial softening points thereof can be decreased to the desired temperature range of 80° C. or less. Further, in order to adjust the adhesiveness with respect to the temporary support, a polymer, a supercooling substance, an adhesiveness modifier, a surfactant, a parting agent and/or the like can be added to the high polymeric organic substances, in an amount within a range such that the substantial softening points thereof do not exceed 80° C.

Specific preferable examples of the plasticizer include polypropylene glycol, polyethylene glycol, dioctyl phthalate, diheptyl phthalate, dibutyl phthalate, tricresyl phosphate, cresyl diphenyl phosphate, biphenyl diphenyl phosphate, polyethylene glycol mono(meth)acrylate, polyethylene glycol di(meth)acrylate, polypropylene glycol mono(meth)acrylate, polypropylene glycol di(meth)acrylate, an addition reaction product of epoxy resin and polyethylene glycol mono(meth)acrylate, an addition reaction product of organic diisocyanato and polyethylene glycol mono(meth)acrylate, an addition reaction product of organic diisocyanato and polypropylene glycol mono(meth)acrylate, and a reaction product between di(meth)acrylate and addition product of bisphenol A and polyethylene oxide.

An amount of the plasticizer is preferably 0 to 200% by weight, more preferably 10 to 150% by weight, and still more preferably 20 to 100% by weight, with respect to the sum of the following resins (A) and (B) forming the thermoplastic resin layer. Especially, as described in JP-A No. 7-28232, a combination of (A) an alkali-soluble thermoplastic resin having a mass average molecular weight of 50,000 to 500,000 and a Tg temperature of 0 to 140° C. and (B) an alkali-soluble thermoplastic resin having a mass average molecular weight of 3,000 to 30,000 and a Tg temperature of 30 to 170° C. at a mass ratio of 5/95 to 95/5 is preferable. An especially preferable example of the resin (A) is a methacrylic acid/2-ethylhexyl methacrylate/benzyl methacrylate/methyl methacrylate copolymer (copolymer composition molar ratio: 5/10/30/55; mass average molecular weight: 100,000; Tg: about 70° C.). An especially preferable example of the resin (B) is a styrene/acrylic acid copolymer (copolymer composition molar ratio: 65/35; mass average molecular weight: 10,000; Tg: about 100° C.). An especially preferable range of the mass ratio (A)/(B) is 30/70 to 60/40. An especially preferable example of the plasticizer is a compound, which is obtained by adding 10 mol of ethylene oxide to 1 mol of bisphenol A, to methacrylesterify the both end alcohols of bisphenol A. The plasticizer is especially preferably added in an amount of 30 to 60% with respect to the total mass of the resins (A) and (B).

The alkali-soluble thermoplastic resin layer is obtained by applying and drying the coating solution in which the above component is uniformly dissolved in a solvent. Preferable examples of the solvent include a high-boiling solvent such as methoxy propylene glycol acetate, ethyl 2-hydroxypropynate, methyl 3-methoxypropionate, ethyl 3-ethoxypropionate, methyl lactate, ethyl lactate, cyclohexanone or methyl isobutyl ketone, or a mixture thereof; and a low-boiling solvent such as methyl ethyl ketone or acetone, or a mixture thereof; and a mixture of the high-boiling solvent and the low-boiling solvent. A mass composition ratio of the high-boiling solvent to the low-boiling solvent is selected within a range of 1/99 to 99/1. When the ratio is less than 1/99, coating and drying speeds are slow, and when the ratio is greater than 99/1, irregular drying tends to occur. The mass composition ratio of the high-boiling solvent to the low-boiling solvent is selected preferably within a range of 90/10 to 10/90, and most preferably within a range of 80/20 to 20/80.

The alkali-soluble thermoplastic resin layer can be formed by applying the coating solution containing the binder and the like onto the adhesive surface of the temporary support of the present invention, by a generally well-known coating method, such as a dip coating method, an air-knife coating method, a curtain coating method, a wire-bar coating method, a gravure coating method, or an extrusion coating method. The thickness of the alkali-soluble thermoplastic resin layer is preferably at least 1 $\mu$m. When the thickness is less than 1 $\mu$m, it is difficult to completely cover deviations of at least 0.5 $\mu$m in the thickness of the undercoat. Further, the thickness of the alkali-soluble thermoplastic resin layer is generally no greater than about 100 $\mu$m, preferably no greater than about 50 $\mu$m, and especially preferably no greater than about 20 $\mu$m, in terms of limitation due to the coating production applicability.

Intermediate Layer

The intermediate layer is provided in order to prevent the thermoplastic resin layer and the photoresist layer from disadvantageously mixing with each other. The intermediate layer may be made of any well-known materials that disperse or dissolve in water or an alkaline aqueous solution and that do not dissolve or hardly dissolve in the organic solvent in the coating solution for the thermoplastic resin layer. Examples of the material include a polyvinyl ether/maleic anhydride polymer, a water-soluble salt of carboxyalkyl cellulose, water-soluble cellulose ethers, a salt of carboxyalkyl starch, a water salt, polyvinyl alcohol, polyvinyl pyrrolidone, various polyacrylamides, various water-soluble polyamides, a water-soluble salt of a polyacrylic acid, gelatin, an ethylene oxide polymer, a water-soluble salt of a group comprising various starches and simulants thereof, a copolymer of styrene/maleic acid, and a maleate resin, and a combination thereof, which are described in JP-A No. 46-2121 and JP-B No. 56-40824.

As the material for the intermediate layer, (1) water-soluble polyvinyl butyral alone or (2) a combination of polyvinyl alcohol and polyvinyl pyrrolidone is especially preferable. A saponification rate of the polyvinyl alcohol is preferably at least 80 mol %, and the content of the polyvinyl pyrrolidone is generally 1 to 75% by mass, preferably 1 to 60% by mass, and especially preferably 10 to 50% by mass, with respect to solid matter in the intermediate layer. When the content is less than 1% by mass, sufficient adhesiveness with respect to the positive photoresist layer is not obtained, and when the content is more than 75% by mass, resistance to a solvent in the coating solution for the photoresist layer is degraded. A thickness of the intermediate layer is about 0.1 $\mu$m to 5 $\mu$m, preferably 0.3 $\mu$m to 4 $\mu$m, and especially preferably 0.5 $\mu$m to 2 $\mu$m. When the thickness is less than about 0.1 $\mu$m, the resistance to the solvent in the coating solution for the photoresist layer is insufficient, and when the thickness is more than about 5 $\mu$m, the drying load is increased and the coating speed is limited.

A solvent in the coating solution for the intermediate layer is selected from water alone and a mixture of a water-miscible organic solvent and water. In order to increase adhesiveness with respect to the underlaid alkali-soluble thermoplastic resin layer, the solvent is preferably selected so as to slightly swell the alkali-soluble thermoplastic resin layer. Preferable examples of the solvent include mixtures such as water/methanol, water/ethanol, water/propanol, water/methoxyethanol, water/methoxypropanol, water/acetone and the like. A mass composition ratio of the water to the organic solvent can be selected within a range of 99/1 to 50/50. When the ratio is more than 99/1, effects of the solvent are not obtained, and when the ratio is less than 50/50, sufficient solubility of the water-soluble resin is not obtained. The ratio is preferably within a range of 95/5 to 60/40, and more preferably within a range of 90/10 to 70/30.

Positive Photoresist Layer

The positive photoresist layer is obtained by applying and drying a photosensitive composition comprising an alkali-soluble carboxylic acid group containing binder (component I) and a 1,2-quinonediazide positive photosensitive substance (component II).

Alkali-Soluble Carboxylic Acid Group Containing Binder

The carboxylic acid group containing binder, which is component I, may be any resins that are soluble in alkaline water having a pH level of 8 to 12, for example, an acrylic copolymer from acrylic monomers containing carboxylic acid group, and a polymer obtained by reacting maleic anhydride or phthalic anhydride with a hydroxyl group containing resin such as cellulose ether or polyhydroxy ethyl methacrylate. The acrylic copolymer from acrylic monomers containing carboxylic acid group is preferably a copolymer of a carboxylic acid group containing monomer and another copolymerizable monomer.

Examples of the carboxylic acid group containing monomer include (meth)acrylic acid, vinyl benzoic acid, maleic acid, maleic anhydride, itaconic acid, itaconic anhydride, crotonic acid, cinnamic acid, acrylic dimer and the like. Further, as the carboxylic acid group containing monomer, an addition reaction product of a monomer having a hydroxyl group such as 2-hydroxyethyl (meth)acrylate and a cyclic anhydride such as maleic anhydride or phthalic anhydride can be also used. Out of these, (meth)acrylic acid is especially preferable.

An example of another copolymerizable monomer is an ethylene unsaturated monomer which is copolymerizable with the carboxylic acid group containing monomer, and the copolymerizable monomer is selected so as not to cause dark reaction while preserving the monomer with the carboxylic acid group. Preferable examples of the copolymerizable monomer include acrylic esters, methacrylic esters, crotonic esters, vinyl esters, maleic diesters, fumaric diesters, itaconic diesters, (meth)acrylonitrile, (meth)acrylamides, styrenes and vinyl ethers.

The above examples of the copolymerizable monomer include the following compounds. Examples of the acrylic esters include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate and the like.

Examples of the methacrylic esters include methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate and the like.

Examples of the crotonic esters include butyl crotonate, hexyl crotonate and the like. Examples of the vinyl esters include vinyl acetate, vinyl propionate, vinyl butylate, vinyl methoxyacetate, vinyl benzoate and the like. Examples of the maleic diesters include dimethyl maleate, diethyl maleate, dibutyl maleate and the like.

Examples of the fumaric diesters include dimethyl fumarate, diethyl fumarate, dibutyl fumarate and the like. Examples of the itaconic diesters include dimethyl itaconate, diethyl itaconate, dibutyl itaconate and the like.

Examples of the acrylamides include acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide and the like.

Examples of the methacrylamides include methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide and the like.

Examples of the vinyl ethers include methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, alpha-methyl styrene and the like.

In addition to these compounds, maleimide, vinylpyridine, vinylpyrrolidone, vinylcarbazole and the like can be also used. These compounds may be used singly or in combination. Especially preferable examples of other monomers include methyl acrylate, methyl methacrylate, ethyl acrylate, ethyl methacrylate, butyl acrylate, butyl methacrylate, benzyl methacrylate, styrene, methyl styrene, alpha-methyl styrene, chloro styrene, bromo styrene, chloromethyl styrene, hydroxy styrene and the like.

The acrylic copolymer from the carboxylic acid group containing monomers is obtained by copolymerizing the respective monomers by a well-known method, such as by dissolving the monomers in an appropriate solvent and adding a radical polymerization initiator thereto such that the monomers are polymerized in the solution. The polymerization may be conducted in a state in which the monomers are dispersed in an aqueous medium, i.e., emulsion polymerization. The solvent can be arbitrarily selected depending upon the monomers to be used and the solubility of the copolymer to be generated. Appropriate examples of the solvent include methanol, ethanol, propanol, isopropanol, 1-methoxy-2-propanol, acetone, methyl ethyl ketone, methyl isobutyl ketone, methoxypropyl acetate, ethyl lactate, ethyl acetate, acetonitrile, tetrahydrofuran, dimethylformamide, chloroform and toluene, and a mixture thereof. Examples of the polymerization initiator include azo type compounds such as 2,2'-azobis(isobutyronitrile) (AIBN) and 2,2'-azobis-(2,4'-dimethylvaleronitrile), peroxides such as a benzoyl peroxide, persulfate and the like. In the acrylic copolymer obtained from the carboxylic acid group containing monomers, a composition ratio of a unit comprising the carboxylic acid group to the entire repeated units of the acrylic copolymer is 1 mol % to 60 mol %, preferably 5 mol % to 50 mol %, and most preferably 10 mol % to 40 mol %. When the composition ratio is less than 1 mol %, the developability with respect to alkaline water is insufficient, and when the composition ratio is more than 60 mol %, the resistance of a cured insulating layer to a release solution after baking is insufficient.

A molecular weight of the acrylic copolymer from the carboxylic acid group containing monomers can be arbitrarily adjusted. A mass average molecular weight thereof is 1,000 to 1,000,000, preferably 2,000 to 200,000, and especially preferably 4,000 to 100,000. When the molecular weight is less than 1,000, strength of the film is insufficient and stable production thereof is difficult. When the molecular weight is more than 1,000,000, developability is reduced. Especially preferable examples of the alkali-soluble resin include a copolymer of methyl methacrylate and methacrylic acid (copolymer composition ratio: 70 to 85 mol %/30 to 15 mol %; mass average molecular weight: 50,000 to 140,000), a copolymer of benzyl methacrylate and methacrylic acid (copolymer composition ratio: 65 to 75 mol %/35 to 25 mol %; mass average molecular weight: 30,000 to 150,000), a copolymer of styrene and maleic acid (copolymer composition ratio: 50 to 70 mol %/50 to 30 mol %; mass average molecular weight: 10,000 to 200,000), and a copolymer of 2-hydroxyethyl methacrylate and benzyl methacrylate and methacrylic acid (copolymer composition ratio: 10 to 30 mol %/40 to 60 mol %/50 to 10 mol %; mass average molecular weight: 10,000 to 200,000).

According to the present invention, the content of the alkali-soluble resin in the total solids of the positive photoresist composition is 10 to 90% by mass, preferably 30 to 80% by mass, and especially preferably 40 to 75% by mass. When the content is less than 10% by mass, solubility of the coating film from the composition in the alkaline aqueous solution is degraded, and development speed is decreased. When the content is more than 90% by mass, the content of the other components is insufficient, and photosensitivity and quality of the insulating film image are thereby degraded.

1,2-Quinonediazide Positive Photosensitive Substance

The 1,2-quinonediazide positive photosensitive substance, which is component II, will be now described. As the 1,2-quinonediazide positive photosensitive substance in the present invention, a substance is preferably used, which can restrict solubility of the alkali-soluble carboxylic acid group containing resin (component I) in the alkaline aqueous solution, but which can also generate acid, when subjected to radiation, to promote solubility of the component I in the alkaline aqueous solution. Examples of the 1,2-quinonediazide compound include 1,2-benzoquinonediazide sulfonic ester, 1,2-naphthoquinonediazide sulfonic ester, 1,2-benzoquinonediazide sulfonic amide, 1,2-naphthoquinonediazide sulfonic amide and the like.

Specific examples of the 1,2-quinonediazide compound include 1,2-naphthoquinonediazide sulfonic esters of trihydroxybenzophenone, such as a 2,3,4-trihydroxybenzophenone-1,2-naphthoquinonediazide-4-sulfonic ester, a 2,3,4-trihydroxybenzophenone-1,2-naphthoquinonediazide-5-sulfonic ester, a 2,4,6-trihydroxybenzophenone-1,2-naphthoquinonediazide-4-sulfonic ester, and a 2,4,6-trihydroxybenzophenone-1,2-naphthoquinonediazide-5-sulfonic ester; 1,2-naphthoquinonediazide sulfonic esters of tetrahydroxybenzophenone, such as a 2,2',4,4'- tetrahydroxybenzophenone-1,2-naphthoquinonediazide-4-sulfonic ester, a 2,2',4,4'-tetrahydroxybenzophenone-1,2-naphthoquinonediazide-5-sulfonic ester, a 2,3,4,3'-tetrahydroxybenzophenone-1,2-naphthoquinonediazide-4-sulfonic ester, a 2,3,4,3'-tetrahydroxybenzophenone-1,2-naphthoquinonediazide-5-sulfonic ester, a 2,3,4,4'-tetrahydroxybenzophenone-1,2-naphthoquinonediazide-4-sulfonic ester, a 2,3,4,4'-tetrahydroxybenzophenone-1,2-naphthoquinonediazide-5-sulfonic ester, a 2,3,4,2'-tetrahydroxy-4'-methylbenzophenone-1,2-naphthoquinonediazide-4-sulfonic ester, a 2,3,4,2'-tetrahydroxy-4'-methylbenzophenone-1,2-naphthoquinonediazide-5-sulfonic ester, a 2,3,4,4'-tetrahydroxy-3'-methoxybenzophenone-1,2-naphthoquinonediazide-4-sulfonic ester, and a 2,3,4,4'-tetrahydroxy-3'-methoxybenzophenone-1,2-naphthoquinonediazide-5-sulfonic ester; 1,2-naphthoquinonediazide sulfonic esters of pentahydroxybenzophenone, such as a 2,3,4,2',6'-pentahydroxybenzophenone-1,2-naphthoquinonediazide-4-sulfonic ester, and a 2,3,4,2',6'-pentahydroxybenzophenone-1,2-naphthoquinonediazide-5-sulfonic ester; 1,2-naphthoquinonediazide sulfonic esters of hexahydroxybenzophenone, such as a 2,4,6,3',4',5'-hexahydroxybenzophenone-1,2-naphthoquinonediazide-4-sulfonic ester, a 2,4,6,3',4',5'-hexahydroxybenzophenone-1,2-naphthoquinonediazide-5-sulfonic ester, a 3,4,5,3',4',5'-hexahydroxybenzophenone-1,2-naphthoquinonediazide-4-sulfonic ester, and a 3,4,5,3',4',5'-hexahydroxybenzophenone-1,2-naphthoquinonediazide-5-sulfonic ester; 1,2-naphthoquinonediazide sulfonic esters of (polyhydroxyphenyl)alkane, such as a bis(2,4-dihydroxyphenyl)methane-1,2-naphthoquinonediazide-4-sulfonic ester, a bis(2,4-dihydroxyphenyl)methane-1,2-naphthoquinonediazide-5-sulfonic ester, a bis(p-hydroxyphenyl)methane-1,2-naphthoquinonediazide-4-sulfonic ester, a bis(p-hydroxyphenyl)methane-1,2-naphthoquinonediazide-5-sulfonic ester, a tri(p-hydroxyphenyl)methane-1,2-naphthoquinonediazide-4-sulfonic ester, a tri(p-hydroxyphenyl)methane-1,2-naphthoquinonediazide-5-sulfonic ester, a 1,1,1-tri(p-hydroxyphenyl)ethane-1,2-naphthoquinonediazide-4-sulfonic ester, a 1,1,1-tri(p-hydroxyphenyl)ethane-1,2-naphthoquinonediazide-5-sulfonic ester, a bis(2,3,4-trihydroxyphenyl)methane-1,2-naphthoquinonediazide-4-sulfonic ester, a bis(2,3,4-trihydroxyphenyl)methane-1,2-naphthoquinonediazide-5-sulfonic ester, a 2,2-bis(2,3,4-trihydroxyphenyl)propane-1,2-naphthoquinonediazide-4-sulfonic ester, a 2,2-bis(2,3,4-trihydroxyphenyl)propane-1,2-naphthoquinonediazide-5-sulfonic ester, a 1,1,3-tris(2,5-dimethyl-4-hydroxyphenyl)-3-phenylpropane-1,2-naphthoquinonediazide-4-sulfonic ester, a 1,1,3-tris(2,5-dimethyl-4-hydroxyphenyl)-3-phenylpropane-1,2-naphthoquinonediazide-5-sulfonic ester, a 4,4'-[1-[4-[1-[4-hydroxyphenyl]-1-methylethyl]phenyl]ethylidene]bisphenol-1,2-naphthoquinonediazide-4-sulfonic ester, a 4,4'-[1-[4-[1-[4-hydroxyphenyl]-1-methylethyl]phenyl]ethylidene]bisphenol-1,2-naphthoquinonediazide-5-sulfonic ester, a bis(2,5-dimethyl-4-hydroxyphenyl)-2-hydroxyphenylmethane-1,2-naphthoquinonediazide-4-sulfonic ester, a bis(2,5-dimethyl-4-hydroxyphenyl)-2-hydroxyphenylmethane-1,2-naphthoquinonediazide-5-sulfonic ester, a 3,3,3',3'-tetramethyl-1,1'-spirobiindene-5,6,7,5',6',7'-hexanol-1,2-naphthoquinonediazide-4-sulfonic ester, a 3,3,3',3'-tetramethyl-1,1'-spirobiindene-5,6,7,5',6',7'-hexanol-1,2-naphthoquinonediazide-5-sulfonic ester, a 2,2,4-trimethyl-7,2',4'-trihydroxyflavan-1,2-naphthoquinonediazide-4-sulfonic ester, and a 2,2,4-trimethyl-7,2',4'-trihydroxyflavan-1,2-naphthoquinonediazide-5-sulfonic ester.

These 1,2-quinonediazide compounds (component II) can be used singly or in combination. The content of the 1,2-quinonediazide compound in the total solids of the photoresist composition is 5 to 90% by mass, preferably 10 to 70% by mass, and especially preferably 15 to 50% by mass. When the content is less than 5% by mass, the amount of acid generated via irradiation is small, whereby the difference between the solubility of irradiated portions and that of nonirradiated portions in the alkaline aqueous solution serving as a developer is small, and accurate patterning may thus be difficult. When the content is more than 90% by mass, if irradiation is carried out for a short time, a large amount of unreacted component II is left, whereby solubility in the alkaline aqueous solution is insufficient, and development may thus be difficult.

For various purposes, various additives can be added to the positive photoresist composition according to the present invention. Examples of the additives include a surfactant, an adhesion accelerator, a heat-crosslinking agent, a plasticizer, a colorant and the like. The positive photoresist composition according to the present invention can contain the adhesion accelerator as the additive to improve adhesion to the substrate. As the adhesion accelerator, a functional silane coupling agent is preferably used. The functional silane coupling agent used herein refers to a silane compound having at least one reactive substituent such as a carboxyl group, a methacryloyl group, an isocyanate group and/or an epoxy group. Specific examples of the silane compound include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane and the like. The adhesion accelerator is used in an amount of preferably no greater than 10% by mass, and especially preferably no greater than 7% by mass, with respect to the total solids.

Other well-known examples of the adhesion accelerator include benzimidazoles and polybenzimidazoles (JP-A No. 6-27657); a lower hydroxyalkyl substituted pyridine derivative (Japanese Patent Application Registration No. 3,024,695); a nitrogen heterocyclic compound (JP-A No. 7-333841); urea or thiourea (JP-A No. 8-62847); an organophosphorus compound (JP-A No. 11-84644); 8-oxyquinoline, 4-hydroxypteridine, 1,10-phenanthroline, and a 2,2'-bipyridine derivative (JP-A No. 11-223937); benzotriazoles (JP-A No. 2000-171968); an organophosphorus compound and a phenylenediamine compound, 2-amino-1-phenylethanol, N-phenylethanolamine, N-ethyldiethanolamine, N-ethylethanolamine and a derivative (JP-A No. 9-15852); benzothiazole and a benzothiazoleamine salt having a cyclohexyl ring and a morpholine ring (JP-A No. 8-76373); and the like; and any of these can be used as the adhesion accelerator.

The heat-crosslinking agent can be added to the photoresist film in order to improve resistance thereof to dry etching. Although the resistance to dry etching is improved by adding the heat-crosslinking agent and by after-baking, the amount of the heat-crosslinking agent added and the conditions under which after-baking occurs need to be selected in consideration of suitability thereof for the separating process. The heat-crosslinking agent to be used is selected in consideration of preservation stability. Preferable examples of a high-molecular heat-crosslinking agent include a copolymer of 3-chloro-2-hydroxypropyl methacrylate and methacrylic acid, a copolymer of 3-chloro-2-hydroxypropyl methacrylate and cyclohexyl methacrylate and methacrylic acid, and a copolymer of 3-chloro-2-hydroxypropyl methacrylate and benzyl methacrylate and methacrylic acid.

Examples of a low-molecular heat-crosslinking agent include bisphenol A-di(3-chloro-2-hydroxypropyl)ether, poly(3-chloro-2-hydroxypropyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ether of a phenol novolak resin, pentaerythritol tetra(3-acetoxy-2-hydroxypropyl) ether, pentaerythritol poly(3-chloroacetoxy-2-hydroxypropyl)ether, and trimethylolmethane tri(3-acetoxy-2-hydroxypropyl)ether. The heat-crosslinking agent compound is added in an amount of 1 to 50% by mass, preferably 1.5 to 30% by mass, and especially preferably 3 to 10% by mass, with respect to the total solids of the composition.

Examples of the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerine and the like. The plasticizer can be added in an amount of no greater than 30% by mass, preferably no greater than 20% by mass, and more preferably no greater than 10% by mass, with respect to the total solids.

The positive photoresist layer is preferably colored, when used, to examine the properties of a surface of the coated photosensitive layer and coating defects thereof, and a colorant is therefore used in the positive photoresist layer. The colorant is selected so as not to inhibit sensitivity of the positive photoresist resin layer due to light absorption by the colorant. As the colorant, a triarylmethane dye or an organic pigment is preferable. The organic pigment is added so that fine particles thereof are dispersed in the resin. Preferable examples of the dye include crystal violet, methyl violet, ethyl violet, oil blue #603, Victoria Pure Blue BOH, malachite green, diamond green and the like. Further, other colorants described in JP-A Nos. 10-97061 and 10-104827 and in JP-B No. 3-68375 can be also advantageously used.

Examples of the organic pigment include phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045) and rhodamine 6G (C. I. 45160), and any one or more of these can be added as a stable dispersion. The colorant is used in an amount of no greater than 10% by mass, preferably no greater than 7% by mass, and especially preferably no greater than 5% by mass, with respect to the total solids of the composition.

The positive photoresist composition according to the present invention can be prepared by uniformly mixing the above-mentioned components I and II, and other components to be contained as needed. In general, the positive photoresist composition is prepared as a composition solution by dissolving or dispersing the respective components in an organic solvent. The organic solvent may be any solvents that dissolve and uniformly disperse the components I and II and other components to be contained as needed, and that do not react with the components.

Specific examples of the organic solvent include alcohols such as methanol and ethanol; ethers such as tetrahydrofuran; glycol ethers such as an ethylene glycol monomethyl ether, an ethylene glycol dimethyl ether, an ethylene glycol methylethyl ether and an ethylene glycol monoethyl ether; ethylene glycol alkyl ether acetates such as a methyl cellosolve acetate and an ethyl cellosolve acetate; diethylene glycols such as diethylene glycol monomethyl ether, diethylene glycol diethyl ether, diethylene glycol dimethyl ether, diethylene glycol ethylmethyl ether, diethylene glycol monoethyl ether and diethylene glycol monobutyl ether; propylene glycol alkyl ether acetates such as a propylene glycol methyl ether acetate and a propylene glycol ethyl ether acetate; aromatic hydrocarbons such as toluene and xylene; ketones such as acetone, methyl ethyl ketone, cyclohexanone and 4-hydroxy-4-methyl-2-pentanone; esters such as lactic esters such as ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate.

Further, a high-boiling solvent such as N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate or phenyl cellosolve acetate can also be added.

These organic solvents can be used singly or in combination, and the organic solvent to be used is selected so as not to dissolve or swell the underlaid intermediate layer. Preferable examples of the solvent used in the positive photoresist layer solution include a high-boiling solvent such as methoxy propylene glycol acetate, ethyl 2-hydroxypropynate, methyl 3-methoxypropionate, ethyl 3-ethoxypropionate, methyl lactate, ethyl lactate, cyclohexanone or methyl isobutyl ketone, or a mixture thereof; and a low-boiling solvent such as methyl ethyl ketone or acetone, or a mixture thereof; and a mixture of the high-boiling solvent and the low-boiling solvent. A mass composition ratio of the high-boiling solvent to the low-boiling solvent is selected within a range of 1/99 to 99/1. When the ratio is less than 1/99, coating and drying speeds are slow, and when the ratio is greater than 99/1, irregular drying tends to occur. The mass composition ratio of the high-boiling solvent to the low-boiling solvent is selected preferably within a range of 90/10 to 10/90, and most preferably within a range of 80/20 to 20/80.

The surfactant can be used to improve coating ability and smoothness of the obtained coating film. Specific examples of the surfactant to be used include commercially available fluorine or silicon surfactants such as BM-1000 (manufactured by BM Chemie, Inc.); MEGAFAX F142D, F172, F173, F183, F176 PF and F177 PF (manufactured by Dainippon Ink & Chemicals, Inc.); FLUORAD FC-135, FC-170C, FC-430 and FC-431 (manufactured by Sumitomo 3M Ltd.); SURFLON S-112, S-113, S-131, S-141 and S-145 (manufactured by Asahi Glass Co., Ltd.); and SH-28PA, SH-190, SH-193, SZ-6032, SF-8428, DC-57 and DC-190 (manufactured by Toray Silicone Co., Ltd.).

The surfactant is used in an amount of 0.05 to 10% by mass with respect to the total solids. When the amount is less than 0.05% by mass, effects of the surfactant are not obtained, and when the amount is more than 10% by mass, adhesiveness of the resist pattern is degraded. The amount is preferably 0.08 to 5% by mass, and especially preferably 0.1 to 3% by mass.

The coating solution comprising the composition according to the present invention can be prepared by dissolving, for example, the alkali-soluble resin of the present invention, a 1,2-quinonediazide compound or a photopolymerizable photosensitive substance, and other components in a predetermined solvent and/or a mixture thereof in a predetermined ratio. The solution comprising the composition may be used after being filtered by, for example, a micro-filter having a pore size of 0.2 μm.

The positive photoresist layer can be formed by applying the coating solution comprising the positive photoresist composition onto the intermediate layer of the present invention, by a generally well-known coating method, such as a dip coating method, an air-knife coating method, a curtain coating method, a wire-bar coating method, a gravure coating method, or an extrusion coating method. A thickness of the positive photoresist layer is generally 0.2 μm to 30 μm. When the thickness is less than 0.2 μm, resistance to etching is inferior, and when the thickness is more than 30 μm, resolution is degraded. The thickness of the positive photoresist layer is preferably 0.5 μm to 10 μm, and especially preferably 1 μm to 6 μm.

Protective Film

In order to avoid adhesion of impurities and damage during storage, a thin protective film is preferably provided on the positive photoresist layer. Although the protective film may be made of a material which is the same as or similar to that of the temporary support, the protective film needs to be easily separated from the positive photoresist layer when it is used. It is important that a surface of the protective film, which contacts the positive photoresist layer, is smooth. If the surface has protrusions of about 0.01 μm or greater, the protrusions may damage the positive photoresist layer. The protective film is preferably, for example, a silicon paper, a polyolefin sheet or a polytetrafluoroethylene sheet, and especially preferably a polypropylene film or a polyethylene film. A thickness of the protective film is 1 μm to 100 μm, preferably 3 μm to 50 μm, and especially preferably 5 μm to 20 μm. When the thickness is less than 1 μm, strength is insufficient, and when the thickness is more than 100 μm, adhesiveness with regard to the photoresist layer is insufficient.

The positive photoresist transfer material of the present invention is produced through the following process. Initially, the solution for forming the alkali-soluble thermoplastic resin layer is applied to and dried on the adhesive surface of the temporary support, which has the antistatic layer and the adhesive surface, to form the alkali-soluble thermoplastic resin layer. Next, the solution for forming the intermediate layer comprising the solvent, which does not significantly dissolve but to some extent swells the thermoplastic resin layer, is applied to and dried on the thermoplastic resin layer to form the intermediate layer. Then, the solvent, which does not significantly dissolve the intermediate layer, is applied to and dried on the intermediate layer to form the positive photoresist layer. Finally, the photoresist layer is laminated with the protective film. The coating solution for each layer of the present invention can be applied by a generally well-known coating method, such as a dip coating method, an air-knife coating method, a curtain coating method, a roller coating method, a wire-bar coating method, a gravure coating method, or an extrusion coating method using a hopper (described in U.S. Pat. No. 2,681, 294).

Alternatively, the positive photoresist transfer material may be produced by mutually attaching a film having the positive photoresist layer disposed thereon and the temporary support having the alkali-soluble thermoplastic resin layer and the intermediate layer disposed thereon so that the positive photoresist layer and the intermediate layer contact each other, or by mutually attaching a film having the positive photoresist layer and the intermediate layer disposed thereon and the temporary support having the alkali-soluble thermoplastic resin layer disposed thereon so that the intermediate layer and the alkali-soluble thermoplastic resin layer contact each other. Said film may be the protective film, or, alternatively, the protective film may be provided on the positive photoresist layer after said film is removed.

Photoetching Method

Next, a photoetching method using the positive photoresist transfer material of the present invention will be described referring to FIGS. 1 and 2.

Figure 2:
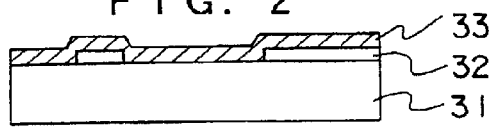
FIG. 2 is a series of cross-sectional views showing a photoetching process using the positive photoresist transfer material according to the present invention.
Figure 2:
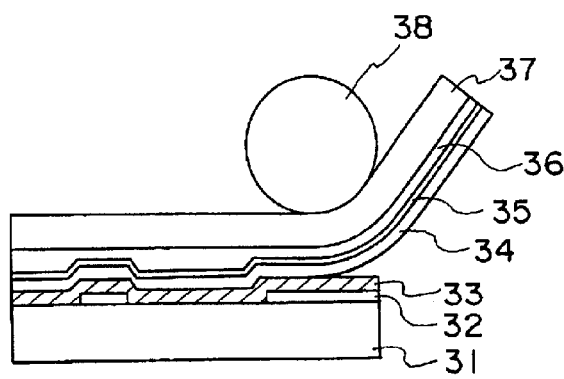
Figure 2:
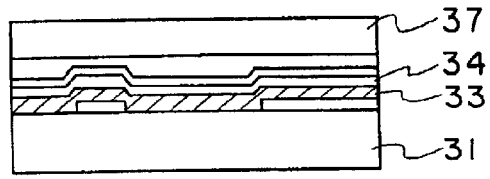
Figure 2:
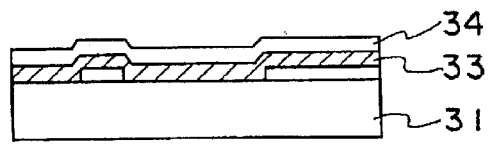
Figure 2:
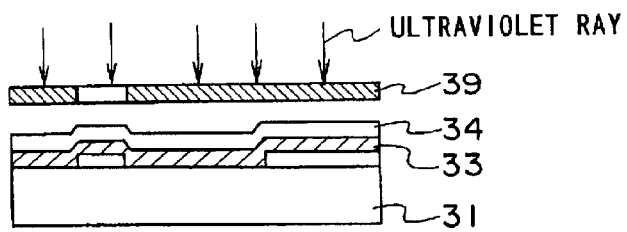
Figure 2:
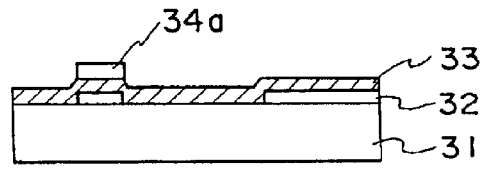
Figure 2:
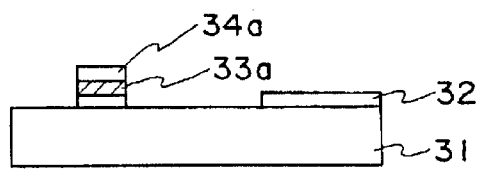
Figure 2:
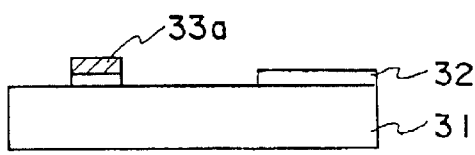
Figure 3:
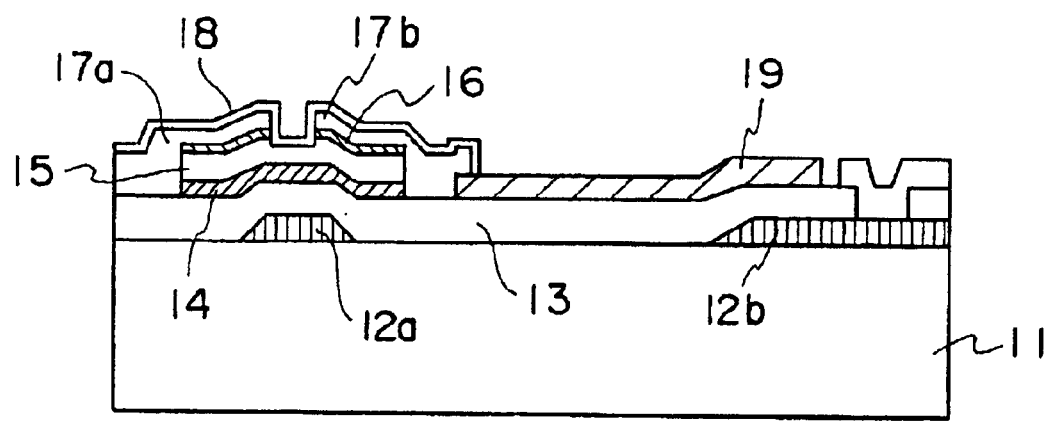
FIG. 3 is a cross-sectional view showing a typical structure of a TFT substrate for an LCD.
Figure 4:
FIG. 4 is a series of cross-sectional views showing a process for manufacturing a TFT array for an LCD.
Figure 4:
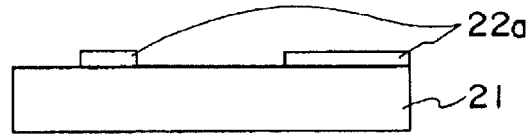
Figure 4:
Figure 4:
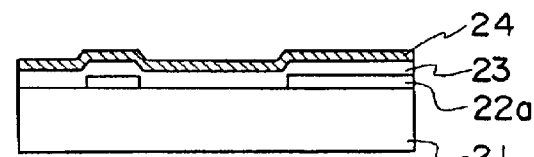
Figure 4:
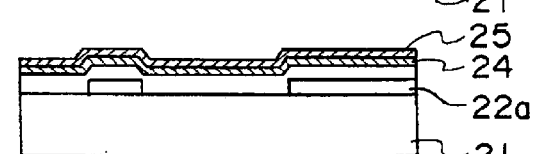
Figure 4:
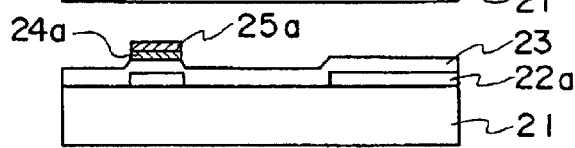
Figure 4:
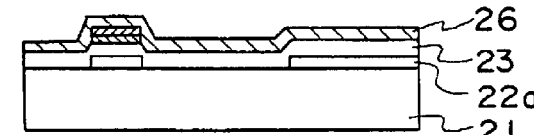
Figure 4:
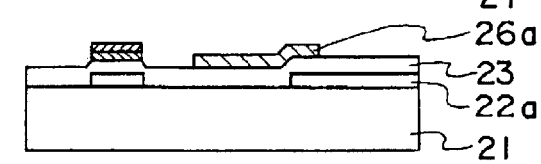
Figure 4:
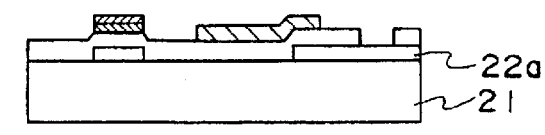
Figure 4:
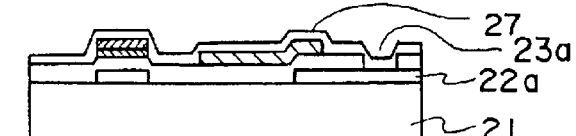
Figure 4:
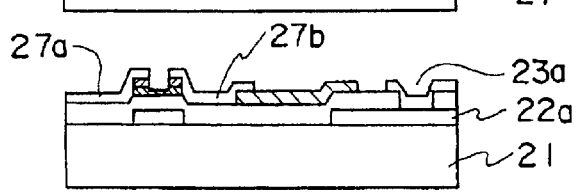

FIG. 1 is a cross-sectional view showing a preferred embodiment of the positive photoresist transfer material according to the present invention, and FIG. 2 is a series of cross-sectional views showing a preferred embodiment of a method for processing a surface of the substrate according to the present invention. In FIG. 1, the reference numeral 34 indicates a positive photoresist layer, the reference numeral 35 indicates an intermediate layer, the reference numeral 36 indicates an alkali-soluble thermoplastic resin layer, the reference numeral 37 indicates a temporary support, the reference numeral 37A indicates an adhesive layer, and the reference numeral 40 indicates a protective film.

The photoetching method using the positive photoresist transfer material shown in FIG. 1 will be now described based on FIG. 2.

A. Heat-Lamination of Film Substrate

A surface of a substrate 31 having a preceding pattern 32 and a thin film 33 disposed thereon is cleaned (step (a)), the protective film 40 is removed from the positive photoresist transfer material, and the positive photoresist layer 34 is transferred onto the thin film 33 of the substrate 31 by a laminator using a heat roller 38 using heat and pressure (step (b), wherein the reference numeral 35 indicates the intermediate layer, the reference numeral 36 indicates the alkali-soluble thermoplastic resin layer, and the reference numeral 37 indicates the temporary support). Under advantageous conditions, a temperature of the heat roller 38 during transfer is 50° C. to 150° C., and a linear load during contact-bonding is 5 kg/cm to 25 kg/cm. Lamination is performed at a conveyance speed of preferably 0.2 m/min to 4 m/min. Under especially preferable conditions, the temperature of the heat roller 38 is 130° C. to 140° C., the linear load during contact-bonding is 10 kg/cm to 15 kg/cm, and the conveyance speed is 1 m/min to 3 m/min. Then, the roll film consisting of the transfer material is cut in correspondence with the size of the substrate 31 (step (c)).

B. Pattern Exposure

A lamination body comprising the glass substrate and the transfer material is cooled to near room temperature, and the photoresist layer 34 and the intermediate layer 35 are separated from each other (step (d)). Then, the formed coating film is irradiated with light through a predetermined patterned mask 39 (step (e)). Thereafter, the exposed portions are developed by using a developer to remove the irradiated portions, such that a pattern 34a is formed (step (f)). Examples of the light to be used herein include g-rays (wavelength: 436 nm); i-rays (wavelength: 365 nm); continuous type and/or bright-line type ultraviolet radiation from a well-known light source such as an extra-high pressure mercury vapor lamp, a xenon lamp, a carbon arc lamp or an argon ion laser; far ultraviolet radiation from a KrF excimer laser or the like; X-rays such as synchrotron radiation; and charged particle beams such as electron beams. Among these, g-rays, i-rays, and ultraviolet radiation, including these rays, with a wavelength of 300 nm to 440 nm are preferable. As described in JP-A No. 6-59119, an optical filter or the like may further be used, in which light having a wavelength of at least 400 nm is transmitted at a rate of no greater than 2%.

C. Development

As the developer for the positive photoresist layer, a dilute aqueous solution of an alkaline substance is used. Alternatively, the solution to which a small amount of a water-miscible organic solvent is added may be used. Appropriate examples of the alkaline substance include alkaline metal hydroxides (e.g., a sodium hydroxide, a potassium hydroxide), alkaline metal carbonates (e.g., a sodium carbonate, a potassium carbonate), alkaline metal bicarbonates (e.g., a sodium hydrogen carbonate, a potassium hydrogen carbonate), alkaline metal silicates (e.g., a sodium silicate, a potassium silicate), alkaline metal metasilicates (e.g., a sodium metasilicate, a potassium metasilicate), ammonia, ethylamine, n-propylamine, diethylamine, triethylamine, methyl diethylamine, dimethyl ethanolamine, triethanolamine, diethanolamine, monoethanolamine, morpholine, tetraalkylammonium hydroxides (e.g., a tetramethylammonium hydroxide, a tetraethylammonium hydroxide), pyrrole, piperidine, 1,8-diazabicyclo[5,4,0]-7-undecene, 1,5-diazabicyclo[4,3,0]-5-nonane, and trisodium phosphate.

A concentration of the alkaline substance in the aqueous solution is 0.01% by mass to 30% by mass, and the pH level thereof is preferably 8 to 14. Appropriate examples of the water-miscible organic solvent include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, and N-methyl pyrrolidone. A concentration of the water-miscible organic solvent is generally 0.1% by mass to 30% by mass. Further, a well-known anionic or nonionic surfactant can also be added to the developer. A concentration of the surfactant is preferably 0.01% by mass to 10% by mass. The developer may be used as a solution for dipping or immersion or a spray liquid. As a development method, a solution overflowing method, a dipping method, a swing-immersion method, a spray method or the like can be used.

D. Etching

Etching is conducted to remove portions of the thin film 33, which are not covered with the resist pattern 34a, such that a pattern 33a is obtained (step (g)). The etching is conducted by using an etching solution (wet etching) or by reacting and vaporizing the thin film 33 via gas discharge under reduced pressure (dry etching). When the wet etching is conducted, after-baking is preferably conducted in order to prevent undercutting due to penetration of the etchant. The after-baking is generally conducted at about 110° C. to 140° C., but the temperature is not necessarily limited thereto. Typical examples of the etchant to be used include ferric chloride/hydrochloric acid types, hydrochloric acid/nitric acid types, hydrobromic acid types and the like, and many other types of etchants have been developed and used. A cerium nitrate ammonium solution is used for Cr; dilute hydrofluoric acid is used for Ti and Ta; hydrogen peroxide water is used for Mo; phosphorus nitric acid is used for MoW and Al; dilute aqua regia, a ferric chloride solution or hydrogen iodide water is used for ITO; buffer hydrofluoric acid is used for SiNx and $SiO_2$; and fluorine nitric acid is used for a-Si and n+a-Si.

In the photoresist film of the present invention, resistance of the resist pattern 34a to dry etching can be improved by adding the heat-crosslinking agent in the positive photoresist layer 34 and conducting the after-baking. In dry etching, an etchant gas is used which is suitable for the respective film type. It is known that carbon tetrafluoride (or carbon tetrachloride)+oxygen, or carbon tetrafluoride (or sulfur hexafluoride)+hydrogen chloride (chlorine) is used for a-Si/n+ and s-Si; carbon tetrafluoride+oxygen is used for a-SiNx; carbon tetrafluoride+oxygen, or carbon trifluoride+oxygen is used for a-SiOx; carbon tetrafluoride (sulfur hexafluoride)+oxygen is used for Ta; carbon tetrafluoride+oxygen is used for MoTa/MoW; chlorine+oxygen is used for Cr; boron trichloride+chlorine is used for Al; and methane group gases, hydrogen bromide, hydrogen bromide+chlorine, or hydrogen iodide is used for ITO.

E. Resist Separation

Finally, the resist 34a used for the pattern forming is removed, for example, by using a separating solution (wet separation), by oxidizing and vaporizing the resist 34a via oxygen gas discharge under reduced pressure (dry separation/ashing), or by oxidizing and vaporizing the resist 34a via ozone and UV light (dry separation/UV ashing) (step (h)). Generally known examples of the separating solution include an aqueous solution such as a sodium hydroxide aqueous solution or a potassium hydroxide aqueous solution, and an organic solvent such as a mixture of amine and dimethyl sulfoxide or N-methyl pyrrolidone. As an example of the organic solvent, a mixture of monoethanolamine/dimethyl sulfoxide (mass mixing ratio: 7/3) is well-known.

EXAMPLES

Hereinafter, the present invention will be further described in detail using examples. However, the present invention is not limited to these examples.

Example 1

A first undercoat and a second undercoat were sequentially formed on one surface of a polyethlene terephthalate film having a thickness of 75 μm (and a width of 1,250 mm), which was biaxially oriented (3.3 times in length and width) and thermoset for 10 minutes at 240° C. Before forming the undercoats, said surface and another surface of the polyethlene terephthalate film were subjected to a corona discharge treatment, in the same manner as A-1 of Example 1 described in JP-A No. 8-36239. Thereafter, an antistatic layer and a surface layer were successively formed on said another surface of the film.

<Coating solution for first undercoat>

| | |
|---|---:|
| styrene/butadiene copolymer latex | 6.3 parts by mass |
| (styrene:butadiene = 67:33; solid content: 40% by mass) | |
| sodium salt of 2,4-dichloro-6-hydroxy-s-triazine | 0.2 parts by mass |

| <Coating solution for second undercoat> | |
|---|---|
| gelatin | 1.6 parts by mass |
| polystyrene fine particles | 0.06 parts by mass |
| (average particle diameter: 2 μm) | |
| compound (1) (see below) | 0.006 parts by mass |
| compound (2) (see below) | 0.006 parts by mass |
| glycine | 0.05 parts by mass |
| distilled water | 98.278 parts by mass | compound (1)

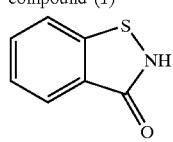

compound (2)

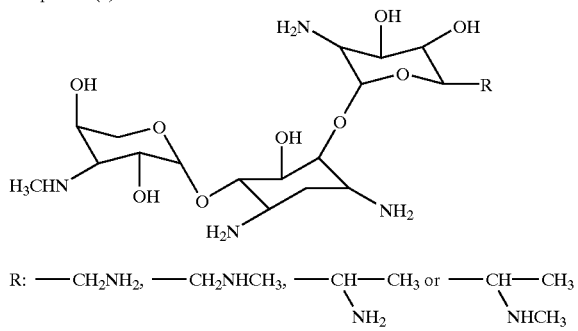

R: —CH₂NH₂, —CH₂NHCH₃, —CH—CH₃ or —CH—CH₃
              |              |
              NH₂           NHCH₃

| <Coating solution for antistatic layer> | |
|---|---|
| Jurimer E410 | 3.1 parts by mass |
| (acrylic resin water dispersion; solid content: 20% by mass; manufactured by Nippon Junyaku Co., Ltd.) | |
| tin oxide-antimony oxide dispersion | 16.5 parts by mass |
| (average particle diameter: 0.1 μm; 30% by mass) | |
| polyoxyethylene phenyl ether | 0.1 parts by mass |
| Sumitex Resin M-3 | 0.2 parts by mass |
| (water-soluble melamine compound; active ingredient: 80% by mass; manufactured by Sumitomo Chemical Co., Ltd.) | |

| <Coating solution for surface layer> | |
|---|---|
| polyolefine | 3.0 parts by mass |
| (Chemipearl S-120; 27% by mass; manufactured by Mitsui Petrochemical Industries, Ltd.) | |
| colloidal silica | 2.0 parts by mass |
| (Snowtex C; manufactured by Nissan Chemical Industries, Ltd.) | |
| epoxy compound | 0.3 parts by mass |
| (Denacol EX-614B; manufactured by Nagase Chemical Co., Ltd.) | |
| polyethylene sulfonate | 0.1 parts by mass |

Next, a coating solution for forming a thermoplastic resin layer having the following composition (1) was applied to the second undercoat of the coating film so that the thermoplastic resin layer had a dry thickness of 16.0 μm. Further, an intermediate layer having the following composition (2) was applied to the thermoplastic resin layer.

| <Composition (1): thermoplastic resin layer> | |
|---|---|
| methyl methacrylate/2-ethylhexyl acrylate/benzyl methacrylate/methacrylic acid copolymer | 15.0 parts by mass |
| (copolymer composition ratio (molar ratio):55/11.7/4.5/28.8; mass average molecular weight: 80,000) | |
| BPE-500 | 7.0 parts by mass |
| (multifunctional acrylate manufactured by Shin-Nakamura Chemical Co., Ltd.) | |
| F177P | 0.3 parts by mass |
| (fluorine containing surfactant manufactured by Dainippon Ink & Chemicals, Inc.) | |
| methanol | 30.0 parts by mass |
| methyl ethyl ketone | 19.0 parts by mass |
| 1-methoxy-2-propanol | 10.0 parts by mass |

| <Composition (2): intermediate layer> | |
|---|---|
| polyvinyl alcohol | 130 parts by mass |
| (PVA205 manufactured by Kuraray Co., Ltd.; saponification rate: 80 mol %) | |
| polyvinyl pyrrolidone | 60 parts by mass |
| (K-30 which is PVP manufactured by GAF Corporation) | |

-continued

| | |
|---|---|
| distilled water | 2,110 parts by mass |
| methanol | 1,750 parts by mass |

Further, a solution for forming a positive photoresist layer having the following composition (3) was applied to the intermediate layer so that the positive photoresist layer had a dry thickness of 0.83 μm. As a result, a positive photoresist transfer material was obtained. When a thickness and variation therein of the positive photoresist layer were measured, the thickness was 0.83 μm±0.008 μm (thickness variation: about ±1%). And then, a protective film was provided on the photoresist layer.

<Composition (3): positive photoresist layer>

| | |
|---|---|
| benzyl methacrylate/methacrylic acid copolymer (molar ratio: 70/30; acid value: 104 mh KOH/g; mass average molecular weight: 30,000) | 21.0 parts by mass |
| propylene glycol monomethyl ether acetate | 172.0 parts by mass |
| 1,2-naphthoquinonediazide-5-sulfonate-4-tert-octylphenyl ester | 8.0 parts by mass |
| fluorine containing surfactant F176PF (manufactured by Dainippon Ink & Chemicals, Inc.) | 0.25 parts by mass |
| Victoria Pure Blue BOH | 0.225 parts by mass |
| 1-cyclohexyl-3-(2-morpholinoethyl)-2-thiourea | 0.90 parts by mass |
| tricresyl phosphate | 8.0 parts by mass |
| methyl ethyl ketone | 47.0 parts by mass |

Initially, an Al film was formed on a top surface of a glass substrate having a size of 1,160 mm×980 mm via magnetron DC sputtering. A protective film was removed from the positive photoresist transfer material (shaped in a roll having a width of 1,150 mm). Thereafter, a surface of the Al film on the glass substrate was laminated with the positive photoresist transfer material via an experimentally manufactured back-up roller type laminator (temperature of heat roll: 130° C.; pressure: 15 kg/cm), and the transfer material was removed such that the intermediate layer and the photoresist layer were separated from each other, so as to transfer the photoresist to the substrate. Subsequently, a mask was overlaid on the photoresist layer, which was then irradiated with light in an amount of 300 mJ/cm$^2$ via an extra-high pressure mercury vapor lamp. Then, the photoresist layer was developed for one minute at 25° C. by a developer, which was a tetramethyl ammonium hydroxide aqueous solution having a concentration of 0.5% by mass, and was showered with extrapure water for one minute. After that, portions of the Al film, which were not covered with the resist, were removed via an etchant of phosphorus nitric acid, so as to form an Al gate electrode pattern. A gate oxide film (SiOx film having a thickness of about 400 nm) was then formed thereon by using a plasma CVD technique.

Next, a semiconductor film (a-Si film having a thickness of about 100 nm) was deposited on the gate oxide film by using the plasma CVD technique, and a slight amount of phosphorus (N+) was further added thereto. Then, only portions thereof that are to be included in TFT were patterned via the photoetching process using the positive photoresist transfer material in the same manner as described above, so as to form a semiconductor layer (a-Si film). After that, an ITO film, which is a transparent conductive film (having a thickness of about 100 nm) for a pixel electrode, was sputtered, and a pixel electrode was formed through the photoetching process.

Then, in order to form a power supply portion for a storage capacitor Cs, a portion of the gate oxide film on the Cs was patterned and removed via the photoetching process. Subsequently, Al was sputtered on portions of the TFT that are to be a drain electrode and a source electrode, and the portions were patterned through the photoetching process to form the electrodes. Finally, a protective nitride (SiNx) film was grown by the CVD. After having been grown, the film was patterned through the photoetching process, completing formation of the protective film. As a result, a TFT array was produced.

In all the photoetching processes, sharpness of pattern edges was satisfactory.

Comparative Example 1

The positive photoresist transfer material was prepared in the same manner as in Example 1, except that the thermoplastic resin layer was formed on a surface of a polyester temporary support, which surface was opposite to the antistatic layer, without forming the adhesive layer. The thickness and variation therein of the photoresist layer were 0.83±0.008 μm (thickness variation: about ±1%).

When the positive photoresist transfer material was transferred onto the Al-sputtered glass substrate and the temporary support was separated therefrom in the same manner as in Example 1, separation was caused between the temporary support and the thermoplastic resin layer. When the photoresist layer was irradiated with UV light in an amount of 300 mJ/cm$^2$ via the photo mask in the same manner, bubbles were generated on the irradiated portions thereof. When it was developed via the tetramethyl ammonium hydroxide aqueous solution, development defects were caused at non-image portions thereof.

Comparative Example 2

The positive photoresist film having a thickness of 0.83 μm was obtained in the same manner as in Example 1, except that, instead of the transfer material, a commercially available positive photoresist (FH2130 manufactured by Fuji Film Arch Co., Ltd.) was applied on the Al thin film formed on the glass substrate having a size of 1,160 mm×980 mm by using a spin coater, and the photoresist was dried for 60 seconds at 120° C. by using a hot plate. When the thickness and variation therein of the photoresist film was evaluated, the thickness was 0.83 μm±0.016 μm (thickness variation: about ±2%).

The photoresist film was developed for 60 seconds via the tetramethyl ammonium hydroxide aqueous solution having a concentration of 2.38%, rinsed with water for 30 seconds and dried. When etching was thereafter conducted in the same manner as in the other examples, the edge linearity of the obtained Al pattern was inferior to that of Example 1.

Example 2

The positive photoresist transfer material was formed in the same manner as in Example 1, except that a coating solution having the following composition was used for the positive photoresist layer.

<Composition of coating solution for positive photoresist layer>

| | |
|---|---|
| benzyl methacrylate/methacrylic acid copolymer (molar ratio: 70/30; acid value; 104 mg KOH/g; mass average molecular weight: 30,000) | 21.0 parts by mass |

-continued

| | |
|---|---|
| propylene glycol monomethyl ether acetate | 172.0 parts by mass |
| 2,4,6-trihydroxybenzophenone-1,2-naphthoquinone-diazide-5-sulfonic ester | 8.0 parts by mass |
| fluorine containing surfactant F176PF (manufactured by Dainippon Ink & Chemical, Inc.) | 0.25 parts by mass |
| Victoria Pure Blue BOH | 0.225 parts by mass |
| 1-cyclohexyl-3-(2-morpholinoethyl)-2-thiourea | 0.90 parts by mass |
| pentaerythritoltetra(3-chloro-2-hydroxypropyl)ether | 2.0 parts by mass |
| methyl ethyl ketone | 47.0 parts by mass |

A silicon wafer was laminated with this photoresist layer, subjected to pattern exposure and development processes, and after-baked for 30 minutes at 180° C. The after-baked wafer was then subjected to oxygen plasma etching using a plasma etching device (SUPER COAT N400 model manufactured by Tokyo Vacuum Co., Ltd.) on the following conditions.

feeder type: cathode couple; electrode size: 80 mmΦ processing gas: oxygen; pressure: 0.065 Torr rf applied voltage: 85 W; rf power concentration: 1.69 W/cm$^2$ processing time: 5 minutes The thickness of the etched film was measured, the thickness lost by the etching was divided by the etching time, and the obtained value was shown as an oxygen plasma rate ($O_2$-RIE Rate (angstromA/sec)) in the following table. The smaller the value of the oxygen plasma rate is, the higher the oxygen plasma resistance is. The dry-etching resistance of this photoresist was improved as compared with that of the photoresist in Example 1.

| | $O_2$-RIE Rate (A/sec) |
|---|---|
| Photoresist in Example 1 | 80 |
| Photoresist in Example 2 | 40 |

When the photoresist was dipped in a mixed separating solution of monoethanolamine/dimethyl sulfoxide for 3 minutes at 80° C., the photoresist was able to be separated without separation residue.

In the transfer material comprising the temporary support, the thermoplastic resin layer, the intermediate layer and the photoresist layer, it has been found that, when the adhesion between the temporary support and the thermoplastic resin layer is increased, the intermediate layer and the photoresist layer can be separated from each other, and the positive photoresist layer can be thereby formed on the substrate by using the transfer method. As a result, it has been possible to form semiconductor circuits for large-sized TFT substrates and PDP substrates.

What is claimed is:

1. A positive photoresist transfer material for transfer to a substrate, the positive photoresist transfer material comprising:

a temporary support including opposite surfaces, one surface of which comprises an adhesive surface;

an antistatic layer provided on the surface opposite to said adhesive surface;

an alkali-soluble thermoplastic resin layer, an intermediate layer and a positive photoresist layer disposed in that sequence on said adhesive surface, the photoresist layer comprising an alkali-soluble carboxylic acid group containing resin and a 1,2-quinonediazide compound; and a protective film disposed on the positive photoresist layer, wherein, when the positive photoresist transfer material is transferred onto the substrate, adhesion between the positive photoresist layer and the intermediate layer is less than adhesion between other layers or surfaces.

2. The positive photoresist transfer material of claim 1, wherein the adhesive surface of the temporary support is subjected to a surface-active treatment.

3. The positive photoresist transfer material of claim 2, further comprising at least one undercoat provided upon the adhesive surface after the adhesive surface has been subjected to said surface-active treatment.

4. The positive photoresist transfer material of claim 1, wherein the temporary support comprises a plastic film.

5. The positive photoresist transfer material of claim 1, wherein the temporary support has a thickness within a range of 5 to 200 µm.

6. The positive photoresist transfer material of claim 1, wherein the antistatic layer comprises a cured product of a polymer and a melamine compound in which conductive metallic oxide particles are dispersed.

7. The positive photoresist transfer material of claim 1, wherein the alkali-soluble thermoplastic resin layer comprises a resin having a softening point of no greater than 80° C.

8. The positive photoresist transfer material of claim 1, wherein the alkali-soluble thermoplastic resin layer contains at least one selected from the group consisting of a plasticizer, a supercooling substance, an adhesiveness modifier, a surfactant and a parting agent.

9. The positive photoresist transfer material of claim 1, wherein composition of the intermediate layer disperses or dissolves in water or an alkaline aqueous solution and does not significantly dissolve in an organic solvent contained in a solution for coating the thermoplastic resin layer.

10. The positive photoresist transfer material of claim 1, wherein the alkali-soluble carboxylic acid group containing resin contained in the positive photoresist layer is substantially soluble in alkaline water having a pH level of 8 to 12.

11. The positive photoresist transfer material of claim 1, wherein the 1,2-quinonediazide compound contained in the positive photoresist layer comprises at least one selected from the group consisting of 1,2-benzoquinonediazide sulfonic ester, 1,2-naphthoquinonediazide sulfonic ester, 1,2-benzoquinonediazide sulfonic amide, and 1,2-naphthoquinonediazide sulfonic amide.

12. The positive photoresist transfer material of claim 1, wherein the positive photoresist layer comprises at least one additive selected from the group consisting of a surfactant, an adhesion accelerator, a heat-crosslinking agent, a plasticizer, a colorant and an adhesiveness modifier.

13. The positive photoresist transfer material of claim 1, wherein the protective film has a thickness of 1 µm to 100 µm, and is selected from the group consisting of a silicon paper, a polyolefin sheet, a polytetrafluoroethylene sheet, a polypropylene film and a polyethylene film.

14. The positive photoresist transfer material of claim 1, wherein the material is produced by a method comprising the steps of:

disposing the positive photoresist layer on the protective film;

providing the alkali-soluble thermoplastic resin layer and the intermediate layer to be successively disposed on the temporary support; and attaching the protective film to the temporary support so that the positive photoresist layer and the intermediate layer contact each other.

15. The positive photoresist transfer material of claim 1, wherein the material is produced by a method comprising the steps of:
   disposing the alkali-soluble thermoplastic resin layer on the temporary support;
   providing the positive photoresist layer and the intermediate layer to be successively disposed on the protective film; and
   attaching the temporary support to the protective film so that the alkali-soluble thermoplastic resin layer and the intermediate layer contact each other.

16. A method for producing a positive photoresist transfer material for transfer to a substrate, the method comprising the steps of:
   forming an alkali-soluble thermoplastic resin layer on an adhesive surface of a temporary support by applying and drying a solution, wherein the temporary support includes an antistatic layer;
   forming an intermediate layer by applying and drying a solution, wherein the solution for the intermediate layer contains a solvent which does not significantly dissolve the alkali-soluble thermoplastic resin layer but slightly swells the alkali-soluble thermoplastic resin layer;
   forming a positive photoresist layer by applying and drying a solution, wherein the solution for the positive photoresist layer contains an alkali-soluble carboxylic acid group containing resin, a 1,2-quinonediazide compound and a solvent which does not significantly dissolve the intermediate layer; and
   laminating the photoresist layer with a protective film, wherein, when the positive photoresist transfer material is transferred onto a substrate, adhesion between the positive photoresist layer and the intermediate layer is less than adhesion between other layers or surfaces.

17. A method for processing a surface of a substrate, the method comprising the steps of:
   preparing a positive photoresist transfer material, by providing an antistatic layer on a surface of a temporary support, and an adhesive surface opposite to the antistatic layer, successively applying an alkali-soluble thermoplastic resin layer, an intermediate layer and a positive photoresist layer on the adhesive surface of the temporary support, and laminating a protective film on the positive photoresist layer, wherein the positive photoresist layer comprises an alkali-soluble carboxylic acid group containing resin and a 1,2-quinonediazide compound;
   overlaying the positive photoresist transfer material on the substrate, wherein, when the positive photoresist transfer material is transferred after having been overlaid on the substrate, adhesion between the positive photoresist layer and the intermediate layer is less than adhesion between other layers or surfaces;
   separating the positive photoresist layer and the intermediate layer from each other so as to remove the temporary support disposed with the alkali-soluble thermoplastic resin layer and the intermediate layer;
   pattern-exposing the positive photoresist layer on the substrate;
   developing the positive photoresist layer; and
   etching the positive photoresist layer and separating it by using a resist separating solution.

18. The method of claim 17, wherein the substrate comprises a TFT array substrate.

19. The method of claim 17, further comprising the step of separating the protective film before the step of overlaying the positive photoresist transfer material on the substrate.

20. The method of claim 17, wherein the step of overlaying the positive photoresist transfer material on the substrate is conducted using at least one of heat and pressure.

* * * * *